United States Patent
Asakura

(10) Patent No.: US 12,192,659 B2
(45) Date of Patent: Jan. 7, 2025

(54) SOLID-STATE IMAGING ELEMENT, IMAGING DEVICE, AND METHOD FOR CONTROLLING SOLID-STATE IMAGING ELEMENT

(71) Applicant: SONY SEMICONDUCTOR SOLUTIONS CORPORATION, Kanagawa (JP)

(72) Inventor: Luonghung Asakura, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 126 days.

(21) Appl. No.: 17/904,316

(22) PCT Filed: Nov. 25, 2020

(86) PCT No.: PCT/JP2020/043731
§ 371 (c)(1),
(2) Date: Aug. 16, 2022

(87) PCT Pub. No.: WO2021/171717
PCT Pub. Date: Sep. 2, 2021

(65) Prior Publication Data
US 2023/0053574 A1  Feb. 23, 2023

(30) Foreign Application Priority Data
Feb. 26, 2020 (JP) .................. 2020-030577

(51) Int. Cl.
*H04N 25/771* (2023.01)
*H01L 27/146* (2006.01)
(Continued)

(52) U.S. Cl.
CPC ..... *H04N 25/771* (2023.01); *H01L 27/14623* (2013.01); *H04N 25/42* (2023.01); *H04N 25/778* (2023.01)

(58) Field of Classification Search
CPC .... H04N 25/75; H04N 25/772; H04N 25/626; H04N 25/65; H04N 25/778; H04N 25/63;
(Continued)

(56) References Cited

U.S. PATENT DOCUMENTS

2017/0244921 A1 * 8/2017 Velichko ............... H04N 25/75

FOREIGN PATENT DOCUMENTS

JP  2017-076899 A   4/2017
JP  2018-147975 A   9/2018
(Continued)

OTHER PUBLICATIONS

International Search Report and Written Opinion of PCT Application No. PCT/JP2020/043731, issued on Feb. 16, 2021, 11 pages of ISRWO.

*Primary Examiner* — Yogesh K Aggarwal
(74) *Attorney, Agent, or Firm* — CHIP LAW GROUP

(57) ABSTRACT

PLS resistance is improved in a solid-state imaging element in which all pixels are simultaneously exposed. A front-stage transfer transistor transfers a charge from a photoelectric conversion element to a front-stage charge holding region and a rear-stage charge holding region which have different capacities. A rear-stage transfer transistor transfers the charge from the rear-stage charge holding region to a floating diffusion region. An intermediate transfer transistor transfers a charge, which remains in the front-stage charge holding region after the charge has been transferred from the rear-stage charge holding region to the floating diffusion region, to the floating diffusion region via the front-stage charge holding region.

12 Claims, 34 Drawing Sheets

(51) Int. Cl.
*H04N 25/42* (2023.01)
*H04N 25/778* (2023.01)

(58) Field of Classification Search
CPC ............ H04N 25/771; H01L 27/14627; H01L 27/1461; H01L 28/40; H01L 27/14609; H01L 27/14621; H01L 27/14629; H01L 27/1463; H01L 27/14612
See application file for complete search history.

(56) References Cited

FOREIGN PATENT DOCUMENTS

| | | |
|---|---|---|
| JP | 2018-160485 A | 10/2018 |
| JP | 2019-169668 A | 10/2019 |

* cited by examiner

SOLID-STATE IMAGING ELEMENT, IMAGING DEVICE, AND METHOD FOR CONTROLLING SOLID-STATE IMAGING ELEMENT

CROSS REFERENCE TO RELATED APPLICATIONS

This application is a U.S. National Phase of International Patent Application No. PCT/JP2020/043731 filed on Nov. 25, 2020, which claims priority benefit of Japanese Patent Application No. JP 2020-030577 filed in the Japan Patent Office on Feb. 26, 2020. Each of the above-referenced applications is hereby incorporated herein by reference in its entirety.

TECHNICAL FIELD

The present technique relates to a solid-state imaging element. More specifically, the present technique relates to a solid-state imaging element for performing analog to digital (AD) conversion for each column, an imaging device, and a method for controlling a solid-state imaging element.

BACKGROUND ART

Conventionally, in solid-state imaging elements, for the purpose of making pixels finer, a column analog to digital converter (ADC) method in which an ADC is disposed for each column outside a pixel array unit to read out pixel signals row by row in order is used. In this column ADC method, when exposure is performed using a rolling shutter method in which exposure is started row by row in order, rolling shutter distortion may occur. Therefore, in order to realize a global shutter method in which exposure is started simultaneously for all pixels, a solid-state imaging element in which a charge holding unit and a transfer transistor for transferring a charge to the charge holding unit are added in a pixel has been proposed (see, for example, PTL 1).

CITATION LIST

Patent Literature

[PTL 1]
JP 2019-169668A

SUMMARY

Technical Problem

In the conventional technique described above, when exposure of all pixels ends, each pixel holds a charge in accordance with an amount of exposure in the charge holding unit, and an ADC of each column reads out signals in accordance with an amount of the charge in order, thereby attempting to realize the global shutter method. However, in the solid-state imaging element described above, light that has leaked from a photoelectric conversion element to the charge holding unit may cause an undesired image artifact. Resistance to this phenomenon is called parasitic light sensitivity (PLS) resistance. In the solid-state imaging element described above, measures are taken to shield the charge holding unit with a light-shielding layer such as metal wiring, but it is necessary to transfer a charge of the photoelectric conversion element to the charge holding unit via the transfer transistor. For this reason, the charge holding unit must be disposed next to the photoelectric conversion element, and it is difficult to prevent light leakage from the photoelectric conversion element to the charge holding unit.

The present technique has been conceived in view of such circumstances, and an object thereof is to improve PLS resistance in a solid-state imaging element in which all pixels are simultaneously exposed.

Solution to Problem

The present technique has been made to solve the above-mentioned problems, and a first aspect thereof is a solid-state imaging element including: a photoelectric conversion element; a front-stage charge holding region; a rear-stage charge holding region having a different capacity from the front-stage charge holding region; a front-stage transfer transistor that transfers a charge from the photoelectric conversion element to the front-stage charge holding region and the rear-stage charge holding region; a rear-stage transfer transistor that transfers the charge from the rear-stage charge holding region to a floating diffusion region; an intermediate transfer transistor that transfers a charge, which remains in the front-stage charge holding region after the charge has been transferred from the rear-stage charge holding region to the floating diffusion region, to the floating diffusion region diffusion region via the front-stage charge holding region; and a light-shielding wall that prevents the charge from leaking from the photoelectric conversion element to the rear-stage charge holding region, and a control method thereof. This has the effect of generating a pixel signal at the time of high illuminance and a pixel signal at the time of low illuminance.

Also, in this first aspect, the front-stage charge holding region and the rear-stage charge holding region may be impurity diffusion regions having the same polarity, and a predetermined impurity diffusion region having a different polarity from those of both the front-stage charge holding region and the rear-stage charge holding region may be disposed between the front-stage charge holding region and the rear-stage charge holding region.

Also, in this first aspect, the front-stage charge holding region and the rear-stage charge holding region may be formed in the same impurity diffusion region. This has the effect of reducing the impurity diffusion region.

Also, in this first aspect, an impurity concentration in a region between the front-stage charge holding region and the rear-stage charge holding region in the impurity diffusion region may be different from that around the region. This has the effect of increasing a potential barrier.

Also, in this first aspect, an adjustment transistor that adjusts a height of the potential barrier between the front-stage charge holding region and the rear-stage charge holding region may be further provided. This has the effect of adjusting the height of the potential barrier.

Also, in this first aspect, a vertical scanning circuit that controls each of the front-stage transfer transistor, the rear-stage transfer transistor, and the intermediate transfer transistor to be turned either on or off may be further provided, the vertical scanning circuit may turn the front-stage transfer transistor and the intermediate transfer transistor on while turning the rear-stage transfer transistor off to transfer the charge to the front-stage charge holding region and the rear-stage charge holding region, may turn the rear-stage transfer transistor on while turning the front-stage transfer transistor and the intermediate transfer transistor off to transfer the charge from the rear-stage charge holding region to the floating diffusion region, and may turn the intermediate transfer transistor and the rear-stage transfer transistor on to transfer the charge from the front-stage charge holding region to the floating diffusion region. This has the effect of transferring the charge in order from each of the front-stage charge holding region and the photoelectric charge holding region.

Also, in this first aspect, a signal processing circuit that compares, between a first pixel signal corresponding to an amount of charge of the rear-stage charge holding region and a second pixel signal corresponding to an amount of charge of the front-stage charge holding region, the first pixel signal with a predetermined threshold and performs processing of selecting one of the first and second pixel signals on the basis of a comparison result may be further provided. This has the effect of reducing PLS of a low illuminance signal.

Also, in this first aspect, the photoelectric conversion element may be formed on a wired front surface of both surfaces of a predetermined semiconductor substrate. This has the effect of improving image quality in a surface-illuminated solid-state imaging element.

Also, in this first aspect, the photoelectric conversion element may be formed on a back surface of a wired front surface of both surfaces of a predetermined semiconductor substrate. This has the effect of improving image quality in a back-illuminated solid-state imaging element.

Also, in this first aspect, the photoelectric conversion element may include first and second photoelectric conversion elements, the front-stage charge holding region may include first and second front-stage charge holding regions, the rear-stage charge holding region may include first and second rear-stage charge holding regions, the front-stage transfer transistor may include first and second front-stage transfer transistors, the intermediate transfer transistor may include first and second intermediate transfer transistors, and the rear-stage transfer transistor may include first and second rear-stage transfer transistors. This has the effect of improving image quality in a solid-state imaging element in which a plurality of pixels share a floating diffusion region.

Also, in this first aspect, a charge discharge transistor that discharges the charge from the photoelectric conversion element, a reset transistor that initializes the floating diffusion layer, an amplification transistor that amplifies the signal corresponding to the amount of charge transferred to the floating diffusion region, and a selection transistor that outputs the amplified signal as a pixel signal in accordance with a predetermined selection signal may be further provided. This has the effect of reading out pixel signals row by row.

Also, a second aspect of the present technique is an imaging device including: a photoelectric conversion element; a front-stage charge holding region; a rear-stage charge holding region having a different capacity from the front-stage charge holding region; a front-stage transfer transistor that transfers a charge from the photoelectric conversion element to the front-stage charge holding region and the rear-stage charge holding region; a rear-stage transfer transistor that transfers the charge from the rear-stage charge holding region to a floating diffusion region; an intermediate transfer transistor that transfers a charge, which remains in the front-stage charge holding region after the charge has been transferred from the rear-stage charge holding region to the floating diffusion region, to the floating diffusion region via the front-stage charge holding region; a light-shielding wall that prevents the charge from leaking from the photoelectric conversion element to the rear-stage charge holding region; and a signal processing circuit that processes a pixel signal in accordance with an amount of charge transferred to the floating diffusion region. This has the effect of processing a pixel signal at the time of high illuminance and a pixel signal at the time of low illuminance.

DESCRIPTION OF EMBODIMENTS

Modes for carrying out the present technique (hereinafter also referred to as "embodiments") will be described below. The description will be given in the following order.
1. First embodiment (an example of transferring a charge to a pair of charge holding regions)
2. Second embodiment (an example of sharing a floating diffusion region and transferring a charge to a pair of charge holding regions)
3. Third embodiment (an example of adjusting a height of a potential barrier and transferring a charge to a pair of charge holding regions)
4. Example of application to mobile object 1. First Embodiment

[Configuration Example of Imaging Device]

Figure 1:
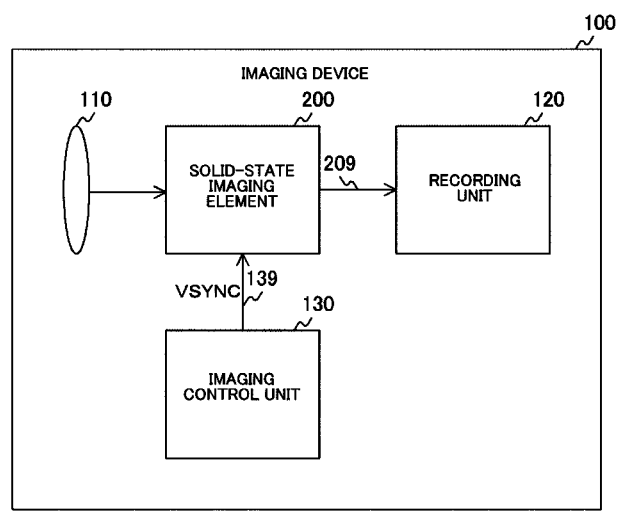
FIG. 1 is a block diagram showing a configuration example of an imaging device according to a first embodiment of the present technique.

FIG. 1 is a block diagram showing a configuration example of an imaging device 100 according to a first embodiment of the present technique. The imaging device 100 is a device that captures image data and includes an imaging lens 110, a solid-state imaging element 200, a recording unit 120, and an imaging control unit 130. As the imaging device 100, for example, a digital camera or an electronic device having an imaging function (a smartphone, a personal computer, or the like) is assumed.

The solid-state imaging element 200 captures image data under the control of the imaging control unit 130. The solid-state imaging element 200 supplies the image data to the recording unit 120 via a signal line 209.

The imaging lens 110 collects light and guides it to the solid-state imaging element 200. The imaging control unit 130 controls the solid-state imaging element 200 to capture the image data. The imaging control unit 130 supplies, for example, an imaging control signal including a vertical synchronization signal VSYNC to the solid-state imaging element 200 via a signal line 139. The recording unit 120 records the image data.

Here, the vertical synchronization signal VSYNC is a signal indicating timing of imaging, and a periodic signal having a constant frequency (60 hertz, etc.) is used for the vertical synchronization signal VSYNC.

Also, although the imaging device 100 records the image data, the image data may be transmitted to the outside of the imaging device 100. In this case, an external interface for transmitting the image data is further provided. Alternatively, the imaging device 100 may further display the image data. In this case, a display unit is further provided.

[Configuration Example of Solid-State Imaging Element]

Figure 2:
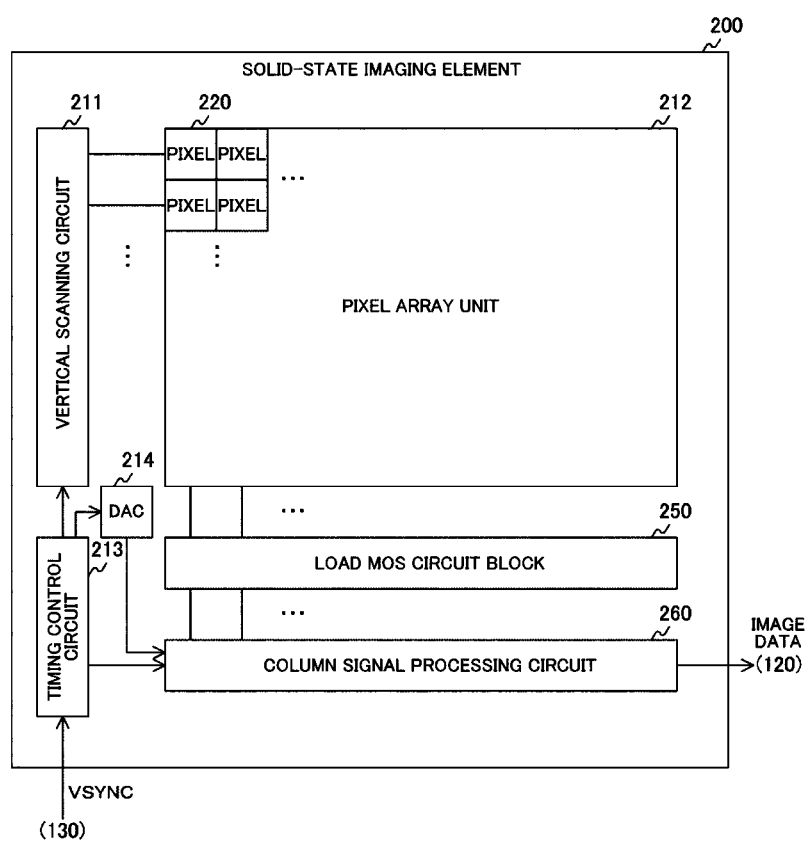
FIG. 2 is a block diagram showing a configuration example of a solid-state imaging element according to the first embodiment of the present technique.

FIG. 2 is a block diagram showing a configuration example of the solid-state imaging element 200 according to the first embodiment of the present technique. The solid-state imaging element 200 includes a vertical scanning circuit 211, a pixel array unit 212, a timing control circuit 213, a digital to analog converter (DAC) 214, a load MOS circuit block 250, and a column signal processing circuit 260. A plurality of pixels 220 are arranged in a two-dimensional grid pattern in the pixel array unit 212.

Hereinafter, a set of pixels 220 arranged in a horizontal direction will be referred to as a "row," and a set of pixels 220 arranged in a direction perpendicular to the row will be referred to as a "column."

The timing control circuit 213 controls operation timing of the vertical scanning circuit 211, the DAC 214, and the column signal processing circuit 260 in synchronization with the vertical synchronization signal VSYNC from the imaging control unit 130.

The DAC 214 generates an analog reference signal that fluctuates with a lapse of time through digital to analog (DA) conversion. For example, a sawtooth wave shape ramp signal is used for the reference signal. The DAC 214 supplies the generated reference signal to the column signal processing circuit 260.

The vertical scanning circuit 211 selects and drives rows in order and outputs analog pixel signals. The pixels 220 photoelectrically convert incident light to generate the analog pixel signals. The pixels 220 supply the pixel signals to the column signal processing circuit 260 via the load MOS circuit block 250.

The load MOS circuit block 250 is provided with MOS transistors that supply a constant current for each column.

The column signal processing circuit 260 executes signal processing such as AD conversion processing and high-dynamic-range (HDR) combination on the pixel signals for each column. The column signal processing circuit 260 supplies image data including the processed signals to the recording unit 120. Also, the column signal processing circuit 260 is an example of the signal processing circuit described in the claims.

[Configuration Example of Pixel]

Figure 3:
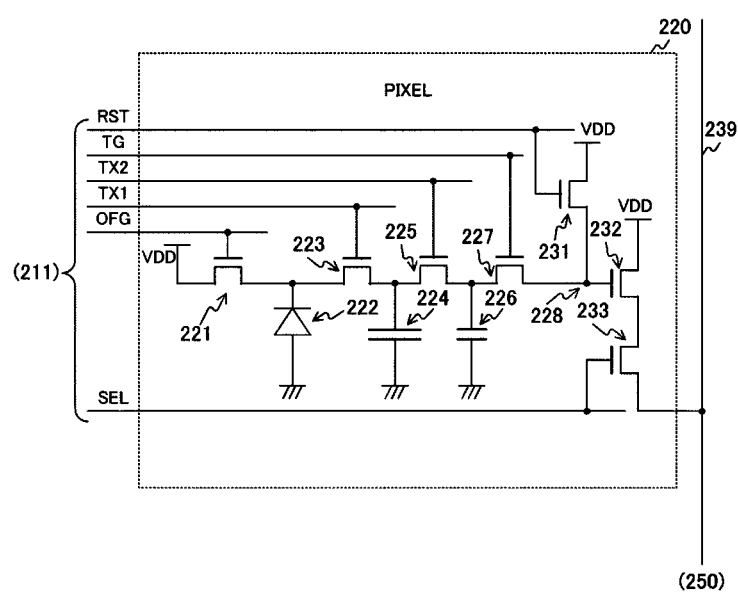
FIG. 3 is a circuit diagram showing a configuration example of a pixel according to the first embodiment of the present technique.

FIG. 3 is a circuit diagram showing a configuration example of the pixel 220 according to the first embodiment of the present technique. The pixel 220 includes a charge discharge transistor 221, a photoelectric conversion element 222, transfer transistors 223, 225 and 227, charge holding regions 224 and 226, and a floating diffusion region 228. Further, the pixel 220 includes a reset transistor 231, an amplification transistor 232 and a selection transistor 233.

Capacities of the charge holding regions 224 and 226 are different from each other. For example, the capacity of the charge holding region 224 is larger than that of the charge holding region 226. The charge holding region 224 is an example of the front-stage charge holding region described in the claims, and the charge holding region 226 is an example of the rear-stage charge holding region described in the claims.

The transfer transistors 223, 225 and 227 are connected in series between the photoelectric conversion element 222 and the floating diffusion region 228. Also, the charge holding region 224 is inserted between a connection node of the transfer transistors 223 and 225 and a ground node, and the charge holding region 226 is inserted between a connection node of the transfer transistors 225 and 227 and a ground node.

The charge discharge transistor 221 discharges a charge from the photoelectric conversion element 222 in accordance with a control signal OFG from the vertical scanning circuit 211. This operation is hereinafter referred to as "photo diode (PD) reset."

Here, for all pixels, the vertical scanning circuit 211 turns the transfer transistor 223 off when exposure starts and turns the transfer transistors 225 and 227 and the reset transistor 231 on when the exposure ends. Thus, the charge holding regions 224 and 226 and the floating diffusion region 228 are initialized. This operation is hereinafter referred to as "storage (ST) reset." Immediately after the ST reset, the vertical scanning circuit 211 turns the transfer transistor 227 and the reset transistor 231 off and turns the transfer transistors 223 and 225 on. Thus, the charge is transferred from the photoelectric conversion element 222 to the charge holding regions 224 and 226.

Immediately after the charge is transferred from the photoelectric conversion element 222 to the charge holding regions 224 and 226, the vertical scanning circuit 211 turns the transfer transistors 223 and 225 off. Thus, the charge holding region 224 and the charge holding region 226 are separated from each other. After this separation, the vertical scanning circuit 211 turns the transfer transistor 227 on.

Thus, the charge is transferred from the charge holding region 226 to the floating diffusion region 228, and an analog pixel signal corresponding to an amount of charge in the charge holding region 226 is AD-converted. Then, the vertical scanning circuit 211 turns the transfer transistors 225 and 227 on. Thus, an analog pixel signal corresponding to an amount of charge in the charge holding regions 224 and 226 is AD-converted.

The photoelectric conversion element 222 generates a charge (electrons, etc.) through photoelectric conversion for incident light.

The transfer transistor 223 transfers the charge from the photoelectric conversion element 222 to the charge holding regions 224 and 226 in accordance with a transfer signal TX1 from the vertical scanning circuit 211. Also, the transfer transistor 223 is an example of the front-stage transfer transistor described in the claims.

The transfer transistor 225 transfers the charge from the charge holding region 224 to the charge holding region 226 in accordance with a transfer signal TX2 from the vertical scanning circuit 211. As described above, the vertical scanning circuit 211 turns the transfer transistors 225 and 227 on after the charge is transferred from the charge holding region 226 to the floating diffusion region 228. For this reason, the charge that remains in the charge holding region 224 is transferred to the floating diffusion region 228 via the charge holding region 226 and the turned-on transfer transistor 227. Also, the transfer transistor 225 is an example of the intermediate transfer transistor described in the claims.

The transfer transistor 227 transfers the charge from the charge holding region 226 to the floating diffusion region 228 in accordance with a transfer signal TG from the vertical scanning circuit 211. Also, the transfer transistor 227 is an example of the rear-stage transfer transistor described in the claims.

The reset transistor 231 extracts the charge from the floating diffusion region 228 to initialize it in accordance with a reset signal RST from the vertical scanning circuit 211. The vertical scanning circuit 211 turns the reset transistor 231 on while turning the transfer transistors 225 and 227 off, so that it can initialize the floating diffusion region 228 only. This operation is hereinafter referred to as "floating diffusion (FD) reset."

The amplification transistor 232 amplifies the analog signal corresponding to the amount of charge in the floating diffusion region 228. The selection transistor 233 outputs the amplified analog signal as a pixel signal to a vertical signal line 239 in accordance with a selection signal SEL from the vertical scanning circuit 211.

Figure 4:
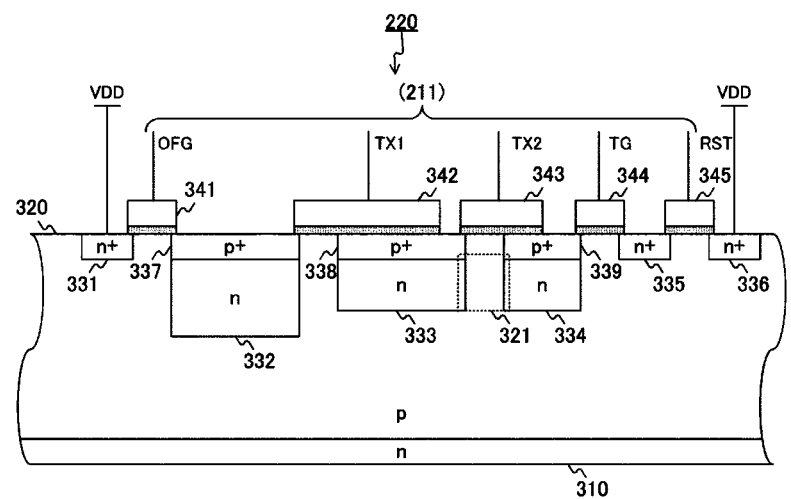
FIG. 4 is an example of a cross-sectional view of the pixel according to the first embodiment of the present technique.

FIG. 4 is an example of a cross-sectional view of the pixel 220 according to the first embodiment of the present technique. A p-type semiconductor substrate 320 in which p-type impurities are diffused is laminated on a n-type semiconductor substrate 310. On a front surface of the p-type semiconductor substrate 320, n+ layers 331, 335, and 336 and p+ layers 337, 338, and 339 are formed. Further, n layers 332, 333, and 334, which are diffusion regions of n-type impurities, are formed below the p+ layers 337, 338, and 339. These p+ layers 337, 338, and 339 function as pinning layers and serve to fill incomplete bonds between atoms at a silicon interface with holes to improve dark current and fix an interface potential.

Further, on the front surface of the p-type semiconductor substrate 320, a gate electrode 341 is provided in a region straddling between the n+ layer 331 and the $p^+$ layer 337 via an oxide film. A gate electrode 342 is provided in a region straddling between the $p^+$ layer 337 and the $p^+$ layer 338 via an oxide film. A gate electrode 343 is provided in a region straddling between the $p^+$ layer 338 and the $p^+$ layer 339 via an oxide film. A gate electrode 344 is provided in a region straddling between the $p^+$ layer 339 and the $n^+$ layer 335 via an oxide film. A gate electrode 345 is provided in a region straddling between the n+ layer 335 and the n+ layer 336 via an oxide film.

The control signal OFG, the transfer signal TX1, the transfer signal TX2, the transfer signal TG, and the reset signal RST are input to the gate electrodes 341, 342, 343, 344, and 345, respectively. Further, the n+ layers 331 and 336 are connected to nodes of a power supply voltage VDD.

The n+ layer 331, the p-type semiconductor substrate 320, the p+ layer 337, and the gate electrode 341 function as the charge discharge transistor 221. Similarly, the gate electrodes 342, 343, 344, and 345 functions as the transfer transistor 223, the transfer transistor 225, the transfer transistor 227, and the reset transistor 231, respectively, together with semiconductor regions below them.

The n layer 332 functions as the photoelectric conversion element 222. The n layers 333 and 334 function as the charge holding regions 224 and 226. As illustrated in the figure, a region 321 between the n layer 333 (charge holding region 224) and the n layer 334 (charge holding region 226) is a diffusion region of p-type impurities (in other words, the p-type semiconductor substrate 320) having a polarity different from those of them.

An applied voltage level to a gate of each transistor of the charge discharge transistor 221 and the like and its control timing can be set independently. In a case in which a particular transistor is turned on, the vertical scanning circuit 211 applies a positive voltage to a gate of that transistor to lower a potential under the gate. Further, when a transistor is turned off, the vertical scanning circuit 211 applies a ground or a negative voltage to the transistor. In a case in which a voltage applied to a gate is negative, holes are attracted to an electric field under the gate and gather at a silicon interface, and the same effect as the above-mentioned pinning layer can be obtained.

Figure 5:
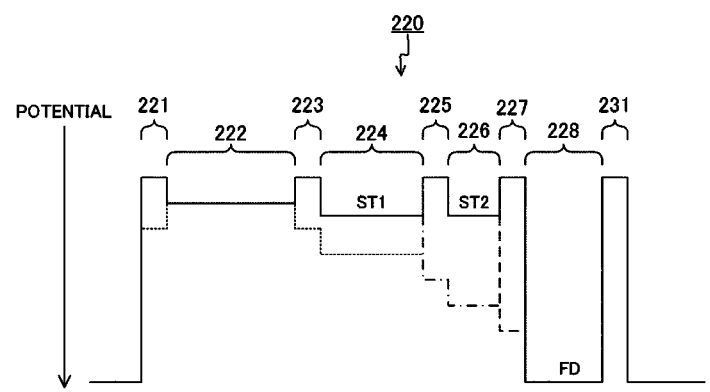
FIG. 5 is an example of a potential diagram of the pixel according to the first embodiment of the present technique.

FIG. 5 is an example of a potential diagram of the pixel 220 according to the first embodiment of the present technique. A solid line in the figure shows potentials when the charge discharge transistor 221, the transfer transistors 223, 225 and 227, and the reset transistor 231 are turned off. Also, fine dotted lines indicate potentials when each of the charge discharge transistor 221 and the transfer transistor 223 is turned on. An alternate long and short dash line indicates a potential when the transfer transistor 225 is turned on. A rough dotted line indicates a potential when the transfer transistor 227 is turned on. Further, reference sign ST1 in the figure shows the charge holding region 224, and reference sign ST2 in the figure shows the charge holding region 226. Reference sign FD indicates the floating diffusion region 228.

As illustrated in the figure, when the transfer transistor 223 is turned off, a potential barrier is generated between the photoelectric conversion element 222 and the charge holding region 224. Further, when the transfer transistor 225 is turned off, a potential barrier is generated between the charge holding region 224 and the charge holding region 226, and when the transfer transistor 227 is turned off, a potential barrier is generated between the charge holding region 226 and the floating diffusion region 228. As illustrated in FIG. 4, there is the p-type region 321 between the n-type charge holding region 224 and the n-type charge holding region 226, and thus, due to this n-p-n structure, as illustrated in FIG. 5, the potential barrier is formed between the charge holding region 224 and the charge holding region 226.

Further, potentials of the charge holding region 224 (ST1) and the charge holding region 226 (ST2) are designed to satisfy the following two conditions. A first condition is that the potential of ST2 when the charge is transferred from the photoelectric conversion element 222 to ST1 and ST2 is lower than that of ST1. A second condition is that there is a potential barrier between ST1 and ST2 during charge holding after the charge is transferred from the photoelectric conversion element 222 to ST1 and ST2. These two conditions can be satisfied by adjusting impurity concentrations of wells that form the potentials of ST1 and ST2 at the time of manufacturing. Alternatively, the two conditions can be satisfied by adjusting voltage levels and timing applied to gates of transistors and polysilicon disposed on or around ST1 and ST2. Alternatively, these conditions can be satisfied by both adjusting the impurity concentrations and adjusting the voltage levels and timing.

Further, when an amount of charge that can be held by ST2 alone is defined as Qh, this Qh is a value proportional to a product of a height of the potential barrier under the second condition and a capacity of ST2.

In a case in which illuminance is so low that the amount of charge transferred from the photoelectric conversion element 222 to ST1 and ST2 is Qh or less, all the charge at the time of transfer passes through ST1 and moves to ST2 due to the first condition. For this reason, ST1 becomes empty. Then, due to the second condition, the charge that has entered ST2 remains and is held in ST2 by the potential barrier. Further, even if there is photoelectric conversion due to light leakage generated in ST1 during charge holding, the charge of ST1 remains in ST1 and does not enter ST2 due to the potential barrier. On the other hand, in a case in which illuminance is so high that the amount of charge transferred from the photoelectric conversion element 222 to ST1 and ST2 becomes larger than Qh, the charge is distributed and held in both ST1 and ST2.

Figure 6:
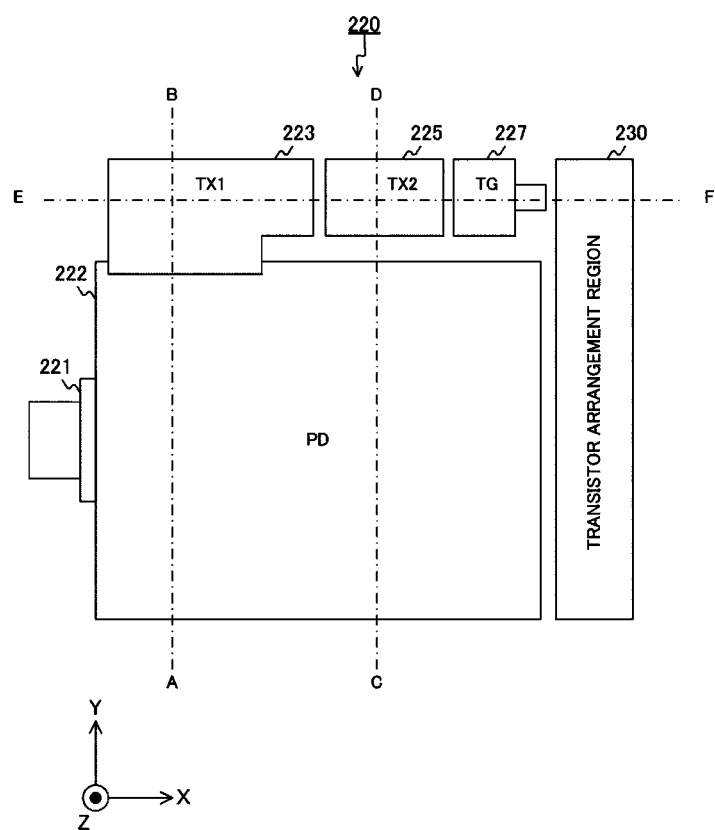
FIG. 6 is a plan view showing an example of a layout of elements in the pixel according to the first embodiment of the present technique.

FIG. 6 is a plan view showing an example of a layout of elements in the pixel 220 according to the first embodiment of the present technique. Hereinafter, the optical axis is defined as the Z axis, and a predetermined axis perpendicular to the Z axis is defined as the X axis. The axis perpendicular to both the X axis and the Z axis is defined as the Y axis." The figure shows a layout seen from the optical axis (Z axis) direction.

As illustrated in the figure, the charge discharge transistor 221, the transfer transistors 223, 225, and 227, and a transistor arrangement region 230 are disposed around the photoelectric conversion element 222. The reset transistor 231, the amplification transistor 232, and the selection transistor 233 are disposed in the transistor arrangement region 230.

Figure 7:
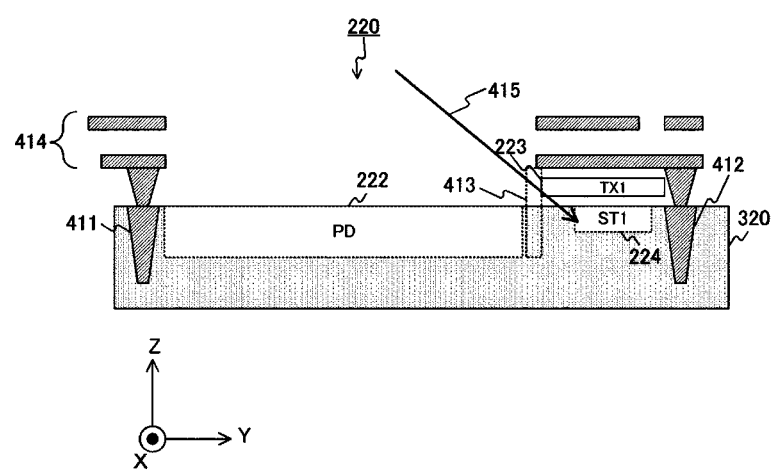
FIG. 7 is an example of a cross-sectional view cut along line A-B according to the first embodiment of the present technique.

FIG. 7 is an example of a cross-sectional view cut along line A-B in FIG. 6 according to the first embodiment of the present technique. A surface of both surfaces of the p-type semiconductor substrate 320, on which a wiring layer 414 is formed, is defined as a front surface, and the photoelectric conversion element 222 and the charge holding region 224 (ST1) are formed on the front surface. The solid-state imaging element 200 having the photoelectric conversion element 222 formed on the front surface in this way is generally called a surface-illuminated solid-state imaging element.

An upper portion of the photoelectric conversion element 222 is open, and an upper portion of the charge holding region 224 (ST1) is plane-shielded form light by a metal of the wiring layer 414. Light-shielding walls 411 and 412 are formed around the pixel 220 by deep trench isolation (DTI). Further, since it is necessary to form a charge transfer channel 413 between the photoelectric conversion element 222 and ST1, a light-shielding wall cannot be placed, and light rays such as incident light 415 may leak into ST1. This leaked light causes an undesired image artifact.

Resistance to this phenomenon is called PLS resistance.

Figure 8:
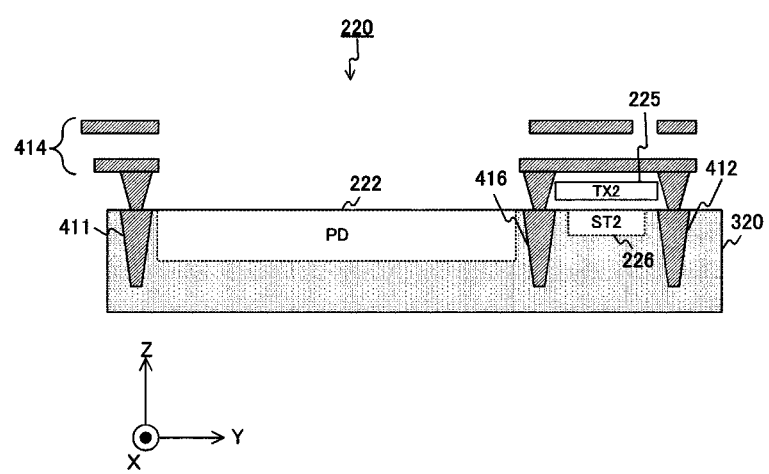
FIG. 8 is an example of a cross-sectional view cut along line C-D according to the first embodiment of the present technique.

FIG. 8 is an example of a cross-sectional view cut along line C-D in FIG. 6 according to the first embodiment of the present technique. An upper portion of the charge holding region 226 (ST2) is also shielded from light by a metal. Further, unlike the charge holding region 224 (ST1), a light-shielding wall 416 is formed between the photoelectric conversion element 222 and ST2. Thus, it is possible to prevent the charge from leaking from the photoelectric conversion element 222 to ST2, and the PLS resistance of ST2 can be made stronger than that of ST1.

Figure 9:
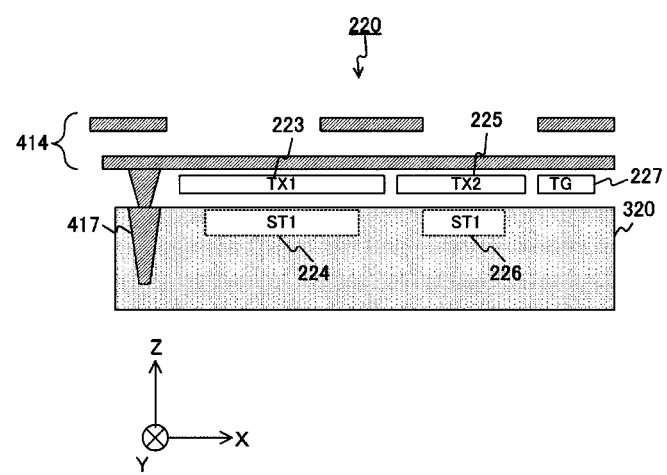
FIG. 9 is an example of a cross-sectional view cut along line E-F according to the first embodiment of the present technique.

FIG. 9 is an example of a cross-sectional view cut along line E-F in FIG. 6 according to the first embodiment of the present technique. A light-shielding wall 417 is formed around the pixel 220, and the upper portions of the charge holding region 224 (ST1) and the charge holding region 226 (ST2) are shielded from light by the metal of the wiring layer 414.

Also, in FIGS. 7 to 9, for convenience of description, a color filter and an on-chip lens on the upper portion of the photoelectric conversion element 222 are omitted.

[Configuration Example of Column Signal Processing Circuit]

Figure 10:
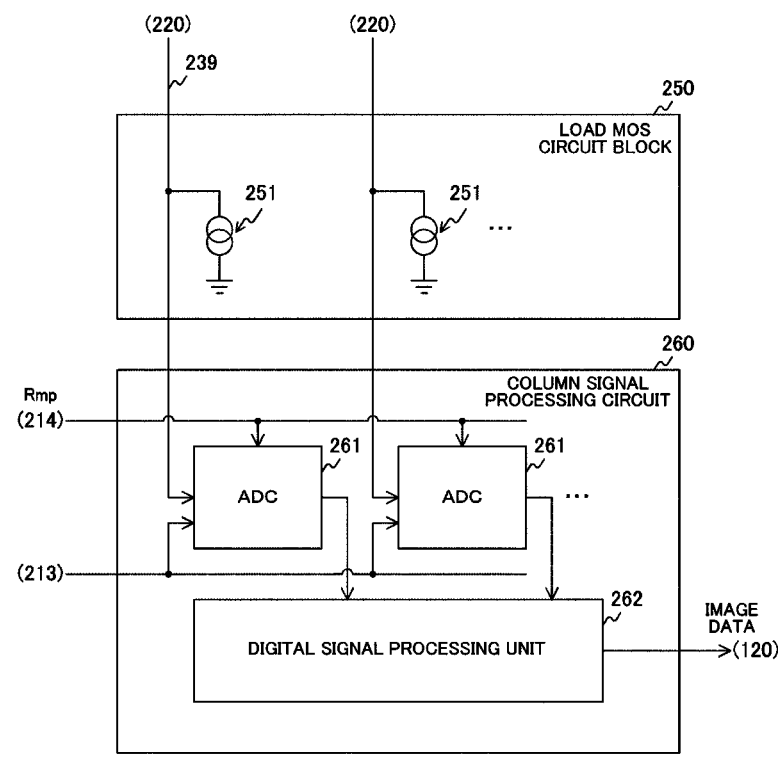
FIG. 10 is a block diagram showing a configuration example of a load MOS circuit block and a column signal processing circuit according to the first embodiment of the present technique.

FIG. 10 is a block diagram showing a configuration example of a load MOS circuit block 250 and a column signal processing circuit 260 according to the first embodiment of the present technique.

The vertical signal line 239 is wired for each column in the load MOS circuit block 250. When the number of columns is set to I (I is an integer), I vertical signal lines 239 are wired. Further, a load MOS transistor 251 that supplies a constant current is connected to each of the vertical signal lines 239.

A plurality of ADCs 261 and a digital signal processing unit 262 are disposed in the column signal processing circuit 260. The ADCs 261 are disposed for each column. When the number of columns is set to I, I ADCs 261 are disposed.

The ADC 261 uses a reference signal (a ramp signal Rmp, etc.) from the DAC 214 to convert an analog pixel signal from a corresponding column into a digital signal. The ADC 261 supplies the digital signal to the digital signal processing unit 262.

The digital signal processing unit 262 performs predetermined signal processing such as correlated double sampling (CDS) processing and HDR combination processing for each of digital signals of each column. The digital signal processing unit 262 supplies image data including the processed digital signals to the recording unit 120.

[Operation Example of Solid-State Imaging Element]

Figure 11:
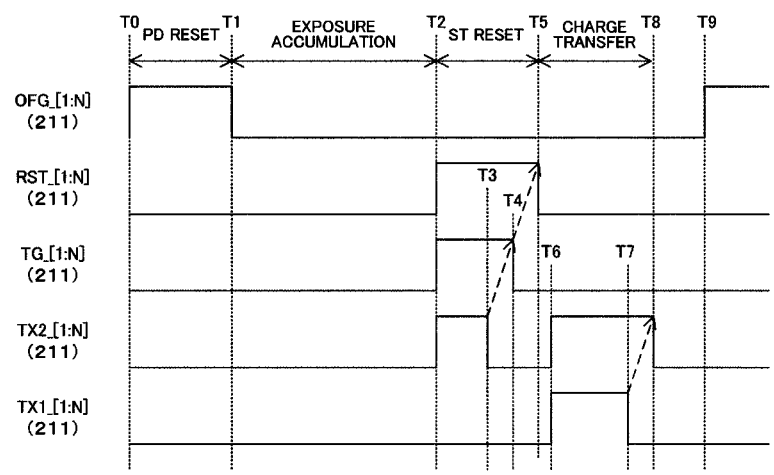
FIG. 11 is a timing chart showing an example of a global shutter operation of the solid-state imaging element according to the first embodiment of the present technique.

FIG. 11 is a timing chart showing an example of a global shutter operation of the solid-state imaging element 200 according to the first embodiment of the present technique. The vertical scanning circuit 211 supplies the control signal OFG to all the pixels from timing T0 immediately before start of exposure to timing T1 of the start of exposure, turns the charge discharge transistor 221 on, and performs PD reset. Hereinafter, the number of rows is set to N (N is an integer), and a control signal to a pixel in an n-th (n is an integer of 1 to N) row is set to OFG_[n]. The same applies to the reset signal RST and the transfer signals TX1, TX2, and TG.

During an exposure period of timings T1 and T2, the photoelectric conversion elements 222 of all pixels perform photoelectric conversion. Such control of exposing all pixels at the same time is called a global shutter method. An amount of charge generated varies depending on illuminance of incident light. At the timing T2 of end of the exposure, the vertical scanning circuit 211 turns the reset transistors 231 and the transfer transistors 225 and 227 of all the pixels on in accordance with the reset signal RST, the transfer signals TX2, and the TG signal. Thus, the charge holding regions 224 and 226 and the floating diffusion regions 228 of all the pixels are reset (ST reset).

Then, at timing T3, the vertical scanning circuit 211 turns the transfer transistors 225 of all pixels off in accordance with the transfer signal TX2, and at timing T4 immediately after T3, turns the transfer transistors 227 of all pixels off in accordance with the transfer signal TG. At timing T5 immediately after the timing T4, the vertical scanning circuit 211 turns the reset transistors 231 of all pixels off in accordance with the reset signal RST. In this way, the vertical scanning circuit 211 turns the transfer transistor 225, the transfer transistor 227, and the reset transistor 231 off in order. This control makes it possible to maintain a state in which the potential decreases from the charge holding region 224 (ST1) toward the floating diffusion region 228, and completely reset ST1 and ST2 of all the pixels.

At timing T6 immediately after the ST reset, the vertical scanning circuit 211 turns the transfer transistors 223 and 225 of all pixels on in accordance with the transfer signals TX1 and TX2 to transfer the charge of the photoelectric conversion element 222 to the charge holding regions 224 and 226. At this time, the potential of the photoelectric conversion element 222 is higher than that of the charge holding region 224 (ST1) and the potential of ST1 is higher than that of the charge holding region 226 (ST2). This magnitude relationship in potential is realized by adjusting implantation concentrations at the time of manufacturing and adjusting on-voltage levels applied to gates of the transfer transistors 223 and 225.

Then, at timing T7, the vertical scanning circuit 211 turns the transfer transistors 223 of all pixels off in accordance with the transfer signal TX1, and at timing T8 immediately after T7, turns the transfer transistors 225 of all pixels off in accordance with the transfer signal TX2. In this way, by turning the transfer transistor 223 and the transfer transistor 225 off in order, a low illuminance charge in ST2 does not flow back to ST1. In the case of low illuminance, the charge is held only in ST2. On the other hand, in the case of high illuminance, the charge is held in both ST1 and ST2.

Figure 12A:
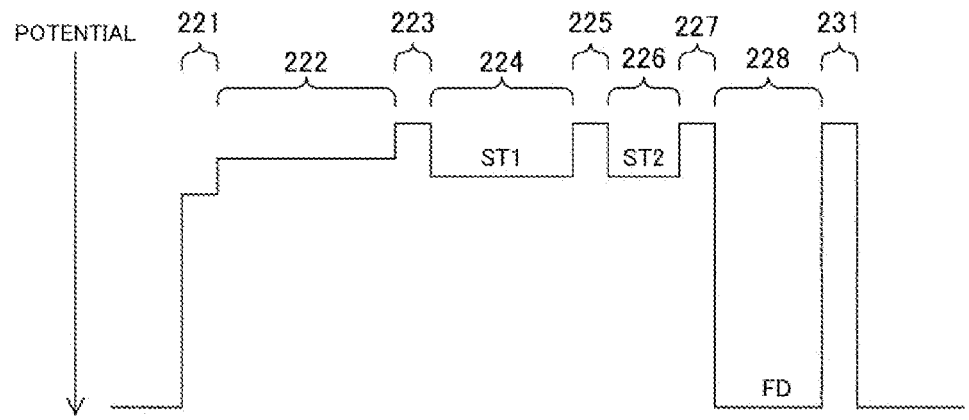
FIGS. 12A, 12B, and 12C are examples of a potential diagram showing the first embodiment of the present technique until an ST reset when illuminance is low.
Figure 12B:
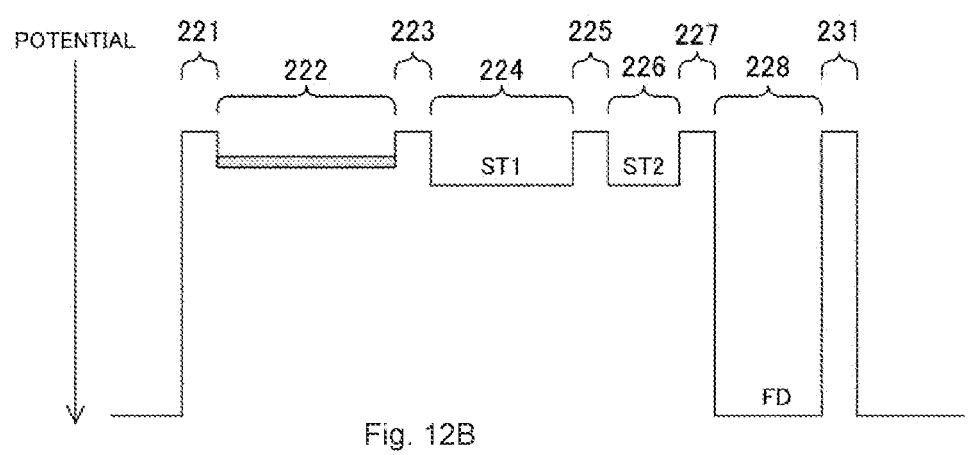
Figure 12C:
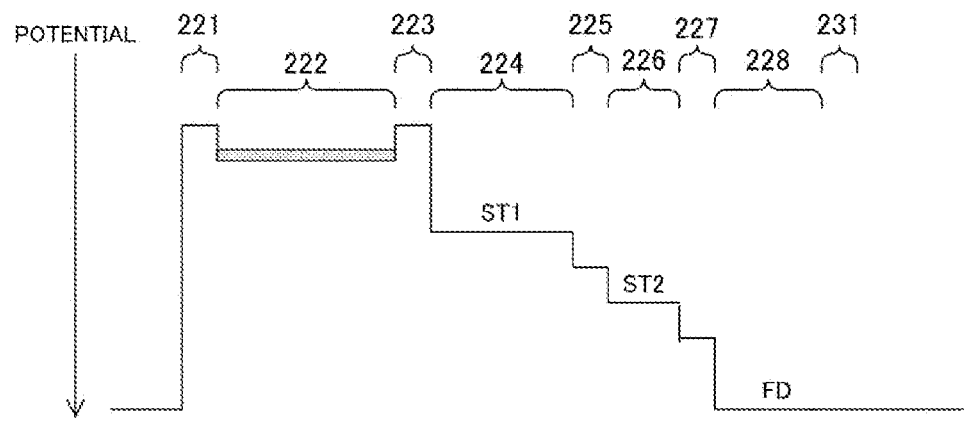

FIGS. 12A, 12B, and 12C an are examples of a potential diagram showing the first embodiment of the present technique until the ST reset when illuminance is low. FIG. 12A is an example of the potential diagram at the time of the PD reset, and FIG. 12B is an example of the potential diagram during exposure accumulation. FIG. 12C is an example of the potential diagram at the time of the ST reset.

As illustrated in a in the figureFIG. 12A, the vertical scanning circuit 211 turns the transfer transistors 223, 225, and 227 and the reset transistor 231 off while turning only the charge discharge transistor 221 on, thereby performing the PD reset. Then, as illustrated in FIG. 12B, the vertical scanning circuit 211 turns the charge discharge transistor 221 off, thereby executing the exposure accumulation. Subsequently, as illustrated in FIG. 12C, the vertical scanning circuit 211 turns the transfer transistors 225 and 227 and the reset transistor 231 on to perform the ST reset.

Figure 13A:
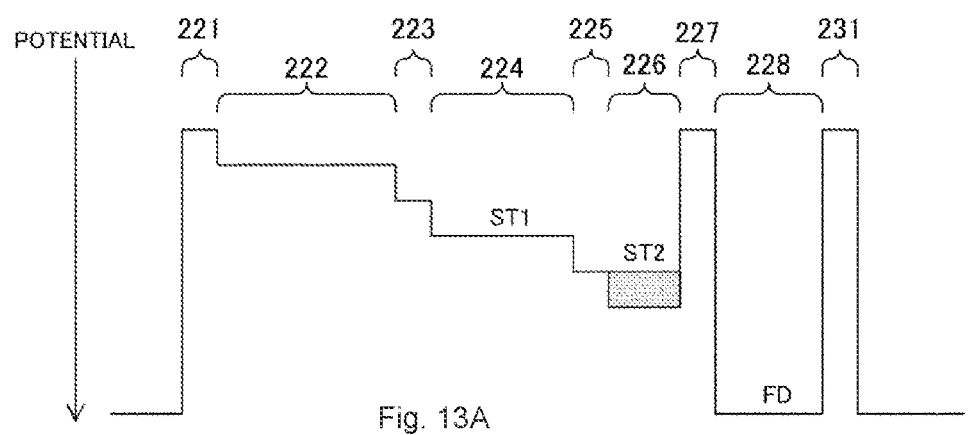
FIGS. 13A and 13B are examples of a potential diagram showing the first embodiment of the present technique until separation of a charge holding region when illuminance is low.
Figure 13B:
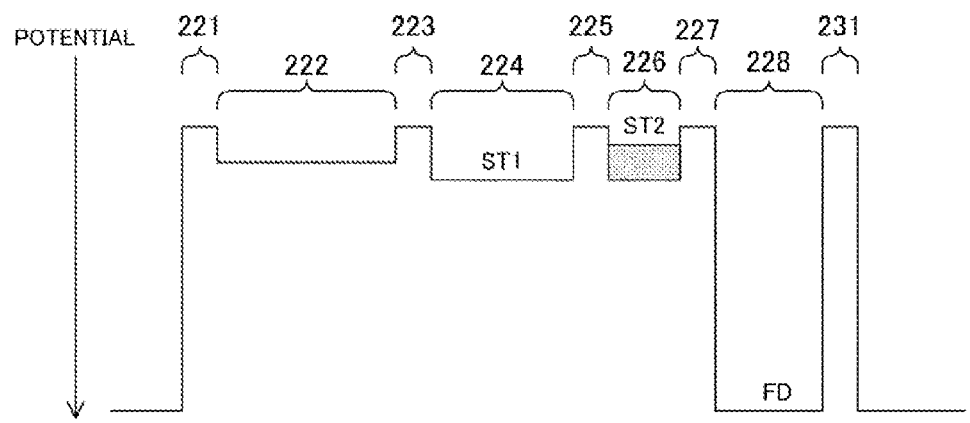

FIGS. 13A and 13B are examples of a potential diagram showing the first embodiment of the present technique until the separation of the charge holding regions when illuminance is low. FIG. 13A is an example of a potential diagram at the time of the charge transfer to the charge holding regions 224 and 226. FIG. 13B is an example of a potential diagram when the charge holding region 224 is separated from the charge holding region 226.

As illustrated in FIG. 13A, the vertical scanning circuit 211 turns the transfer transistors 223 and 225 on while the transfer transistor 227 and the reset transistor 231 are turned off. Thus, the charge is transferred from the photoelectric conversion element 222 to the charge holding regions 224 and 226. In the case of low illuminance, the charge is held only in ST2.

Then, as illustrated in FIG. 13B, the vertical scanning circuit 211 turns the transfer transistors 223 and 225 off, thereby separating the charge holding region 224 from the charge holding region 226.

Figure 14A:
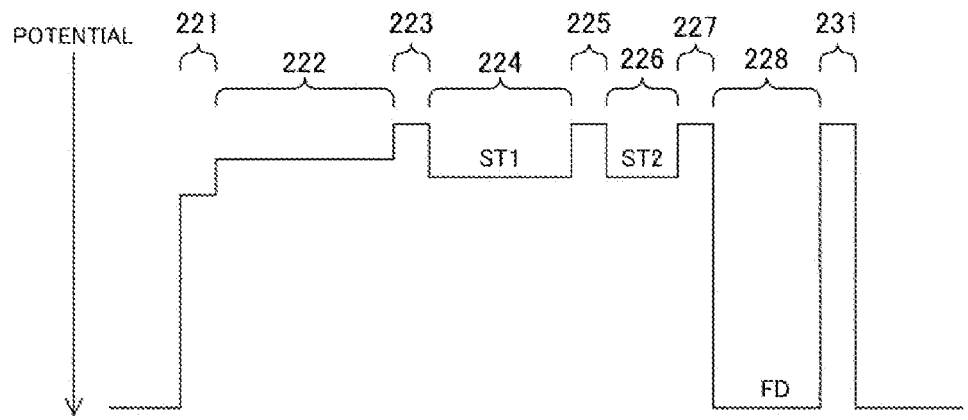
FIGS. 14A, 14B, and 14C are examples of a potential diagram showing the first embodiment of the present technique until an ST reset when illuminance is high.
Figure 14B:
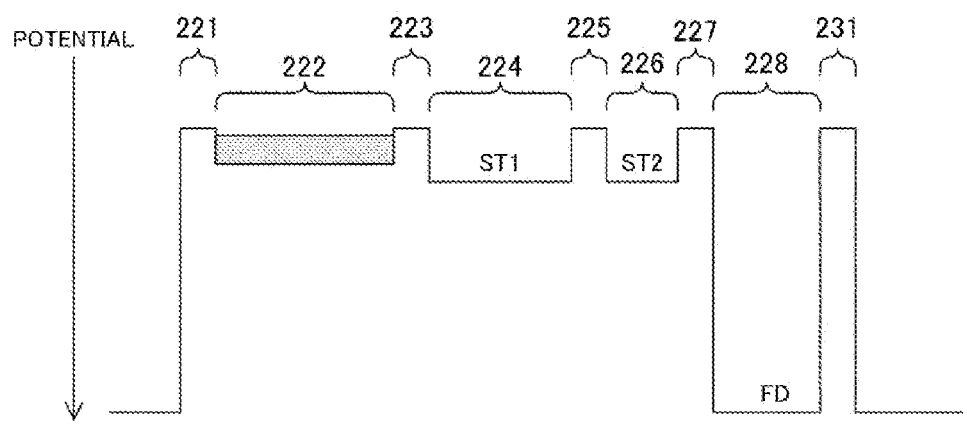
Figure 14C:
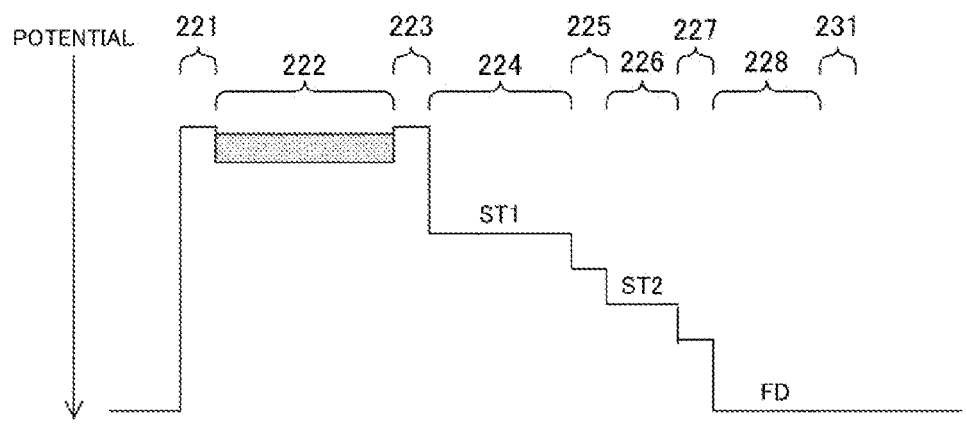

FIGS. 14A, 14B, and 14C are examples of a potential diagram showing the first embodiment of the present technique until the ST reset when illuminance is high. FIG. 14A is an example of a potential diagram at the time of the PD reset, and FIG. 14B is an example of a potential diagram during the exposure accumulation. FIG. 14C is an example of a potential diagram at the time of the ST reset. These potential diagrams are the same as those illustrated in FIGS. 12A, 12B, and 12C, except that the amount of charge is different.

Figure 15A:
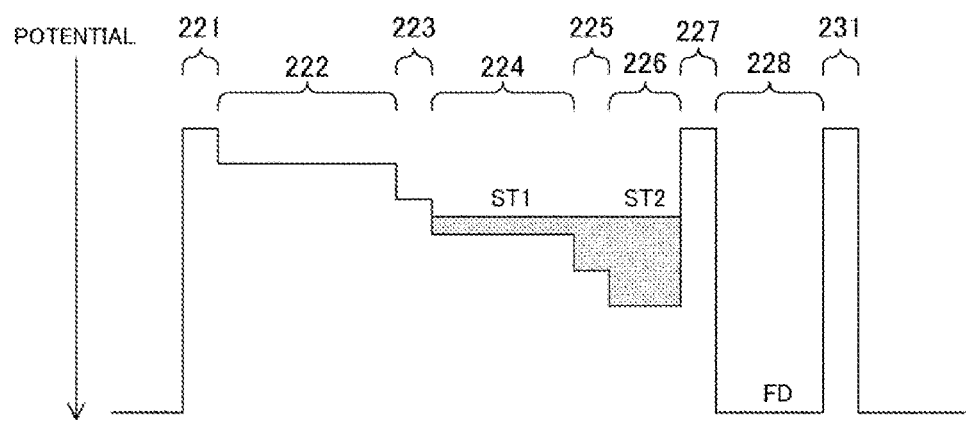
FIGS. 15A and 15B is an are examples of a potential diagram showing the first embodiment of the present technique until separation of a charge holding region when illuminance is high.
Figure 15B:
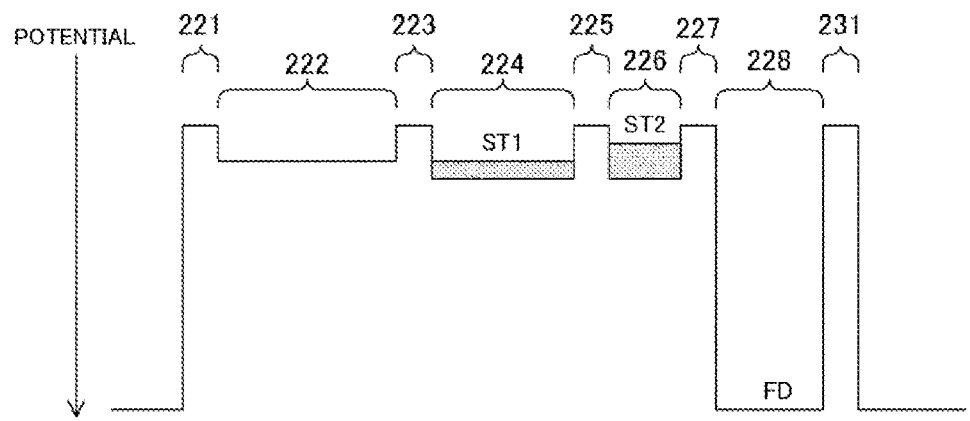

FIGS. 15A and 15B are examples of a potential diagram showing the first embodiment of the present technique until the separation of the charge holding regions when illuminance is high. FIG. 15A is an example of a potential diagram at the time of the charge transfer to the charge holding regions 224 and 226. FIG. 15B is an example of a potential diagram when the charge holding region 224 is separated from the charge holding region 226. These potential diagrams are the same as those illustrated in FIGS. 13A and 13B, except that the amount of charge is different. As illustrated in FIGS. 15A and 15B, in the case of high illuminance, the charge is held in both ST1 and ST2.

Figure 16:
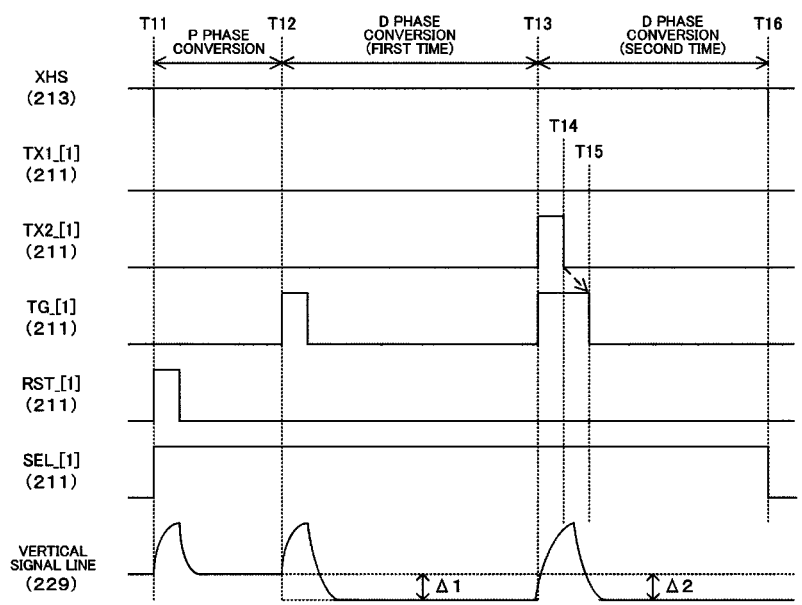
FIG. 16 is a timing chart showing an example of an operation of reading out a row when illuminance is low according to the first embodiment of the present technique.

FIG. 16 is a timing chart showing an example of an operation of reading out a row when illuminance is low according to the first embodiment of the present technique. A readout operation in the figure is executed row by row in order after the global shutter illustrated in FIG. 11.

For example, at timings T11 and T16, a horizontal synchronization signal XHS is supplied to the column signal processing circuit 260 by the timing control circuit 213. The vertical scanning circuit 211 supplies a selection signal SEL in synchronization with the horizontal synchronization signal XHS. For example, when a first row is selected within the period from the timing T11 to T16, a selection signal SEL_[1] is supplied.

At the timing T11, the vertical scanning circuit 211 supplies the reset signal RST over a pulse period to turn the reset transistor 231 on, thereby performing FD reset. In a period until timing T12, a reset level at the time of the FD reset is output to the vertical signal line 239 via the amplification transistor 232 and the selection transistor 233 and is AD-converted by the column signal processing circuit 260. This reset level is also called a P phase level. The P phase level after the AD conversion is defined as Vp.

Then, at the timing T12, the vertical scanning circuit 211 supplies the transfer signal TG over the pulse period to turn the transfer transistor 227 on and transfers the charge in the charge holding region 226 (ST2) to the floating diffusion region 228. The charge in the charge holding region 224 (ST1) and the charge holding region 226 (ST2) is a signal charge generated through photoelectric conversion, and a signal level corresponding to an amount of charge of the signal is called a D phase level. In a period until timing T13, this D phase level is AD-converted by the column signal processing circuit 260. The D phase level after the first AD conversion is defined as Vd1.

Subsequently, at timing T13, the vertical scanning circuit 211 supplies the transfer signals TG and TX2 to turn the transfer transistors 225 and 227 on and transfers the charge in the charge holding region 224 (ST1) to the floating diffusion region 228. Further, at timing T14, the vertical scanning circuit 211 turns the transfer transistor 225 off and at timing T15 immediately after T14, turns the transfer transistor 227 off. By turning the transfer transistors 225 and 227 off in order, the potential of ST2 can be maintained higher than that of the floating diffusion region 228, so that the signal charge of ST1 can be completely transferred to the floating diffusion region 228.

In a period until the timing T13, the D phase level is AD-converted by the column signal processing circuit 260. The D phase level after the second AD conversion is defined as Vd2. In the second time, the charge transferred from the charge holding region 224 to the floating diffusion region 228 is added to the charge transferred from the charge holding region 226 in the first time. For this reason, the second D phase level becomes a level corresponding to a value obtained by adding the amount of charge held in each of the charge holding regions 224 and 226.

The column signal processing circuit 260 performs the following calculation in the CDS processing. By the CDS processing, reset noise of the floating diffusion region 228 and a noise offset of the circuit can be canceled.

$$\Delta 1 = Vd1 - Vp$$

$$\Delta 2 = Vd2 - Vp$$

The column signal processing circuit 260 compares a difference $\Delta 1$ with a predetermined threshold $\Delta th$ and determines whether or not the difference $\Delta 1$ is equal to or less than the threshold $\Delta th$. Here, the threshold $\Delta th$ is an amount of charge that ST2 can safely hold alone and is proportional to a product of the capacity of ST2, the potential barrier between ST1 and ST2, and a charge-voltage conversion efficiency of the floating diffusion region 228.

As illustrated in the figure, in a case in which the difference $\Delta 1$ is equal to or less than the threshold $\Delta th$, the column signal processing circuit 260 determines that illuminance is relatively low and outputs the difference $\Delta 1$ as a final pixel signal. On the other hand, in a case in which the difference $\Delta 1$ is larger than the threshold $\Delta th$, the column signal processing circuit 260 determines that illuminance is relatively high and outputs a difference $\Delta 2$ as the final pixel signal.

In this way, the low illuminance pixel outputs the difference $\Delta 1$, and the high illuminance pixel outputs the difference $\Delta 2$, so that the PLS of the low illuminance signal can be reduced.

In addition, since ST2 can secure a wider distance from the open photoelectric conversion element 222 than ST1, it is difficult for leaked light to reach it. Further, since ST2 only needs to receive a part of the signal charge in the full range, the capacity of ST2 remains small. Due to both of these effects, the light leakage generated in ST2 can be effectively inhibited.

Here, in the image data, in particular, an artifact that generally occurs in a low illuminance signal is easily noticeable. The reason for this may be that a large amount of optical shot noise is included along with a high illuminance signal, and even if there is an artifact, it is buried in the optical shot noise and is not noticeable.

In the solid-state imaging element 200, as described above, a low illuminance charge signal in which an artifact is noticeable is held in ST2 that is less susceptible to light leakage, and thus influence of light leakage is reduced.

Figure 17:
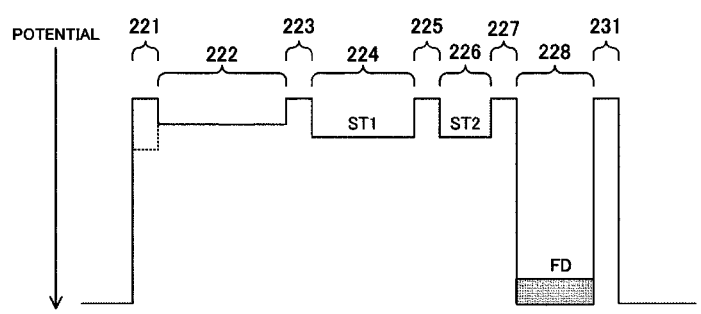
FIG. 17 is an example of a potential diagram at the time of reading out when illuminance is low according to the first embodiment of the present technique.

FIG. 17 is an example of a potential diagram at the time of reading out when illuminance is low according to the first embodiment of the present technique. In the case of low illuminance, no signal charge remains in ST1 when the first D phase level is read out, as illustrated in the figure. The potential diagram at the time of reading out the second D phase level is the same as that of the first D phase level.

Figure 18:
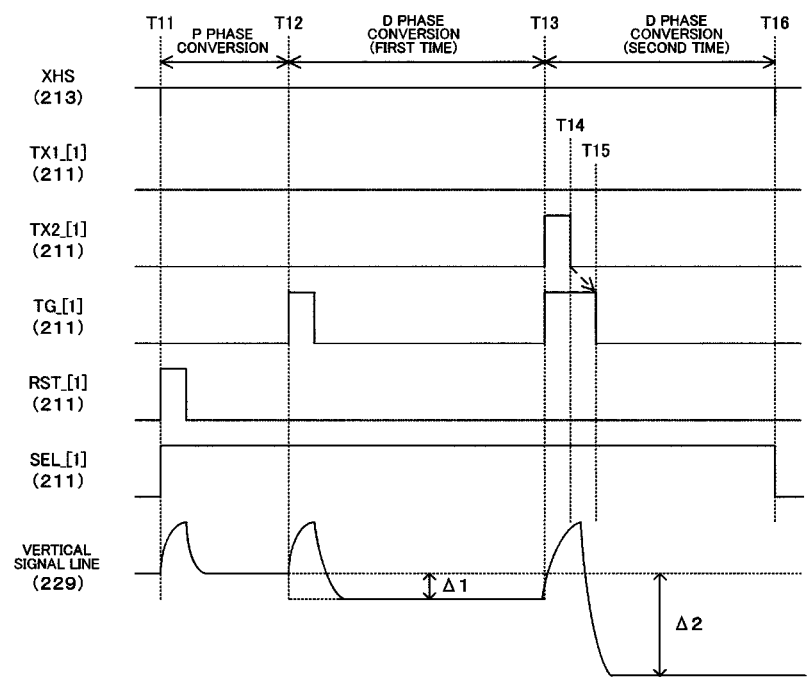
FIG. 18 is a timing chart showing an example of an operation of reading out a row when illuminance is high according to the first embodiment of the present technique.

FIG. 18 is a timing chart showing an example of an operation of reading out a row when illuminance is high according to the first embodiment of the present technique. Readout control in the figure is the same as the control illustrated in FIG. 16 As illustrated in the figure, in a case in which illuminance is high, the difference $\Delta 1$ becomes larger than the threshold $\Delta$th. In this case, the column signal processing circuit 260 outputs the difference $\Delta 2$ as the final pixel signal.

Figure 19A:
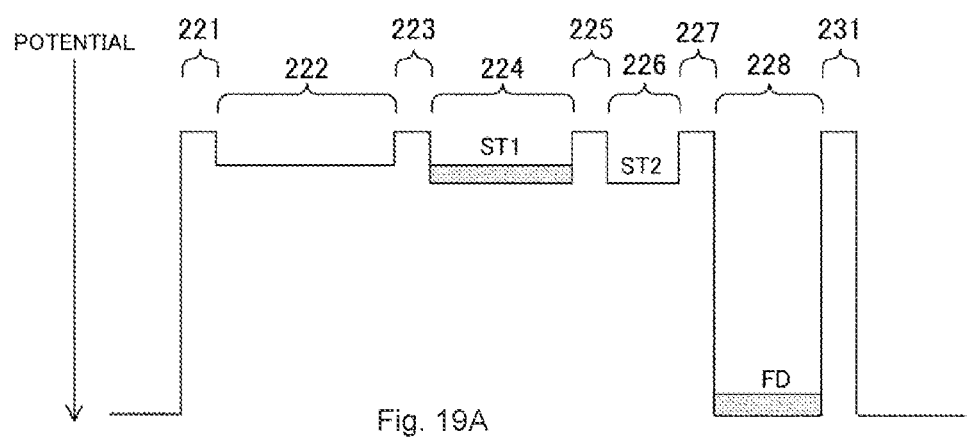
FIGS. 19A and 19B are examples of a potential diagram at the time of reading out when illuminance is high according to the first embodiment of the present technique.
Figure 19B:
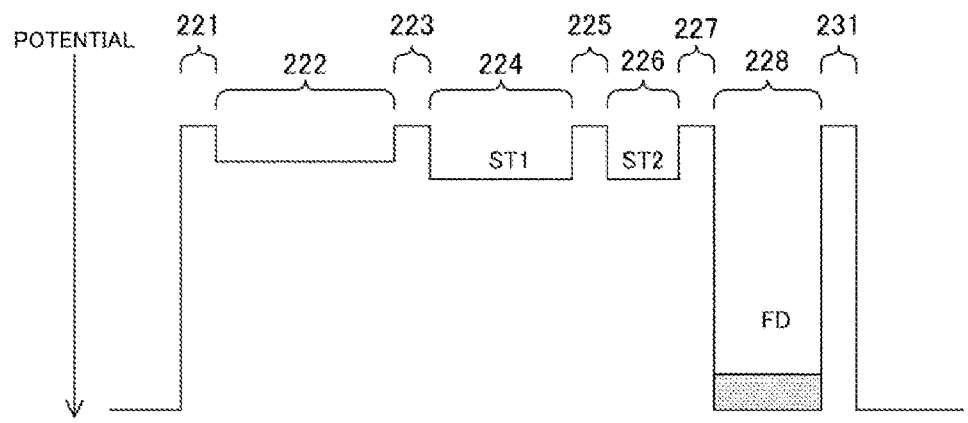

FIGS. 19A and 19B are examples of a potential diagram at the time of reading out when illuminance is high according to the first embodiment of the present technique. FIG. 19A is an example of the potential diagram at the time of reading out the first D phase level, and FIG. 19B example of the potential diagram at the time of reading out the second D phase level.

As illustrated in FIG. 19A, in the case in which illuminance is high, the signal level remains in ST1 when the first D phase level is read out. As illustrated in FIG. 19B, the signal charge remaining in ST1 is transferred to the floating diffusion region 228, added to the amount of charge of the first time, and read out as the second D phase level.

Figure 20:
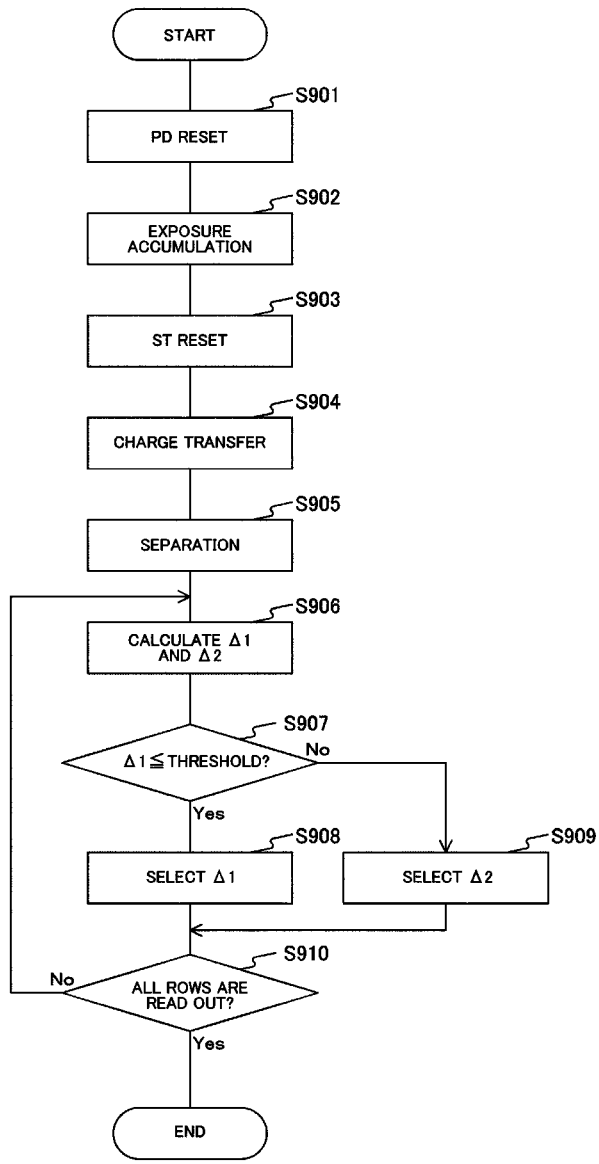
FIG. 20 is a flowchart showing an example of an operation of the solid-state imaging element according to the first embodiment of the present technique.

FIG. 20 is a flowchart showing an example of an operation of the solid-state imaging element 200 according to the first embodiment of the present technique. This operation is started, for example, when a predetermined application for generating an HDR image is executed.

The vertical scanning circuit 211 in the solid-state imaging element 200 performs the PD reset for all pixels (step S901) and executes the exposure accumulation (step S902). After the exposure ends, the vertical scanning circuit 211 performs the ST reset for all the pixels (step S903) and transfers the charge to the charge holding regions 224 and 226 (step S904). The vertical scanning circuit 211 separates the charge holding regions 224 and 226 (step S905).

The vertical scanning circuit 211 selects a row, and the column signal processing circuit 260 calculates the differences $\Delta 1$ and $\Delta 2$ for each column by CDS processing (step S906). The column signal processing circuit 260 determines whether or not the difference $\Delta 1$ is equal to or less than the threshold for each column (step S907). In a case in which the difference $\Delta 1$ is equal to or less than the threshold (step S907: Yes), the column signal processing circuit 260 selects the difference $\Delta 1$ and outputs it as the pixel signal (step S908). On the other hand, in a case in which the difference $\Delta 1$ is larger than the threshold (step S907: No), the column signal processing circuit 260 selects the difference $\Delta 2$ and outputs it as the pixel signal (step S909). Also, processes of steps S906 to S909 are executed for each column in the selected row, but in the figure, for convenience of description, the processes except for one column are omitted.

After step S908 or S909, the solid-state imaging element 200 determines whether or not readout of all rows is completed (step S910). In a case in which the readout of all rows is not completed (step S910: No), the solid-state imaging element 200 repeatedly executes step S906 and subsequent steps. In a case in which the readout of all rows is completed (step S910: Yes), the solid-state imaging element 200 ends the operation for generating the HDR image.

Also, in a case in which a plurality of HDR images are continuously generated, the processes of steps S901 to S910 are repeatedly executed in synchronization with the vertical synchronization signal.

As described above, in the first embodiment of the present technique, the leakage of charge from the photoelectric conversion element 222 to the rear-stage charge holding region 226 is prevented by the light-shielding wall, and thus the PLS resistance is improved. Further, the transfer transistor 223 transfers the charge to the charge holding regions 224 and 226, and the transfer transistors 225 and 227 sequentially transfer the charge held in each of them to the floating diffusion region 228. Thus, the column signal processing circuit 260 can output either a low illuminance signal or a high illuminance signal for each pixel, reduce the PLS of the low illuminance signal, and improve image quality.

First Modified Example

In the first embodiment described above, the surface-illuminated solid-state imaging element 200 has been used, but in the surface-illuminated type, it is required to guide the incident light to the photoelectric conversion element 222 while avoiding the wiring layer 414, which may result in insufficient sensitivity. A solid-state imaging element 200 of a first modified example of the first embodiment is different from that of the first embodiment in that it is a back-illuminated type.

A layout of the solid-state imaging element 200 of the first modified example of the first embodiment when viewed from the Z axis direction is the same as that of the first embodiment illustrated in FIG. 6.

Figure 21:
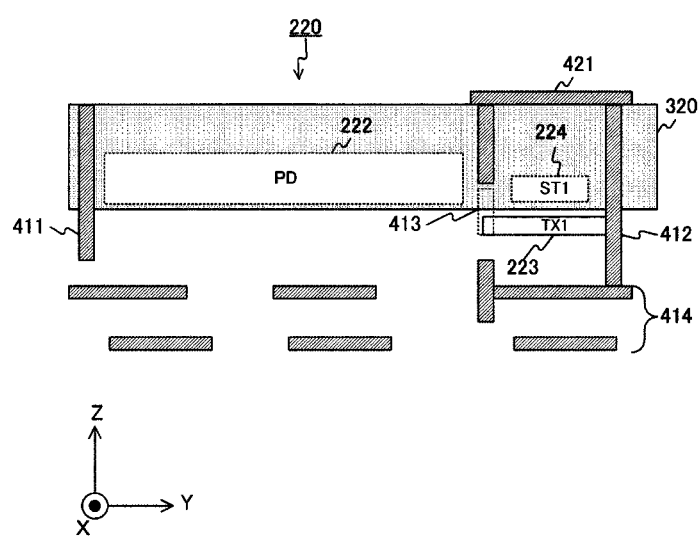
FIG. 21 is an example of a cross-sectional view cut along line A-B according to a first modified example of the first embodiment of the present technique.

FIG. 21 is an example of a cross-sectional view cut along line A-B according to the first modified example of the first embodiment of the present technique. As illustrated in the figure, the surface of both surfaces of the p-type semiconductor substrate 320 on which the wiring layer 414 is formed is used for the front surface, and the photoelectric conversion element 222 is formed on the back surface of the front surface. On the back surface, the upper portion of the charge holding region 224 (ST1) is shielded from light by a metal 421. Further, the light-shielding walls 411 and 412 are formed around the pixel 220 through DTI. As illustrated in the figure, the solid-state imaging element 200 having the photoelectric conversion element 222 formed on the back surface is called a back-illuminated solid-state imaging element.

Figure 22:
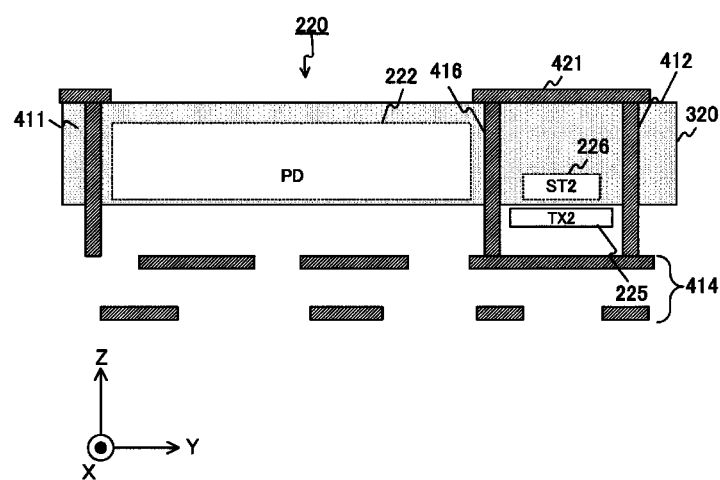
FIG. 22 is an example of a cross-sectional view cut along line C-D according to the first modified example of the first embodiment of the present technique.

FIG. 22 is an example of a cross-sectional view cut along line C-D according to the first modified example of the first embodiment of the present technique. On the back surface, the upper portion of the charge holding region 226 (ST2) is shielded from light by the metal 421. Further, the light-shielding wall 416 is formed between the photoelectric conversion element 222 and ST2. The light-shielding walls 416 and 412 around ST2 extend from the wiring layer 414 along the Z axis direction, penetrate the p-type semiconductor substrate 320, and are connected to the metal 421. This makes it possible to increase light-shielding resistance of ST2.

Figure 23:
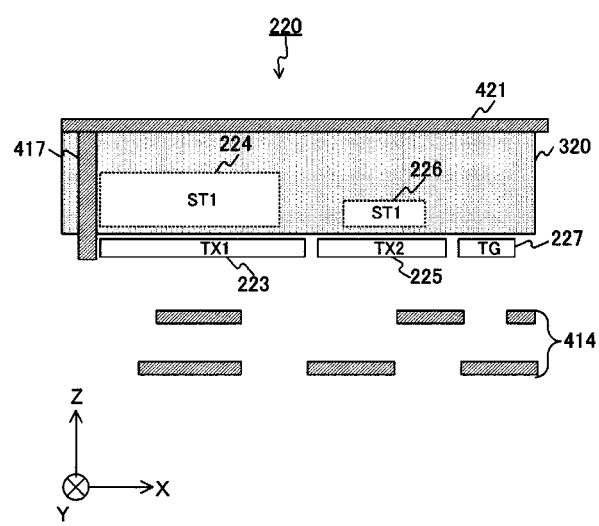
FIG. 23 is an example of a cross-sectional view cut along line E-F according to the first modified example of the first embodiment of the present technique.

FIG. 23 is an example of a cross-sectional view cut along line E-F according to the first modified example of the first embodiment of the present technique. The light-shielding wall 417 is formed around the pixel 220, and the upper portions of the charge holding region 224 (ST1) and the charge holding region 226 (ST2) are shielded from light by the metal 421 on the back surface.

As described above, in the modified example of the first embodiment of the present technique, the photoelectric conversion element 222 is formed on the back surface of the front surface on which the wiring layer 414 on the substrate is formed, and thus it is not necessary to guide the incident light to avoid the wiring layer 414, so that the sensitivity can be improved as compared with a surface-illuminated type.

Second Modified Example

In the first embodiment described above, the floating diffusion region 228 has been disposed for each pixel, but in this configuration, it is difficult to reduce a circuit scale of the pixel array unit 212. A solid-state imaging element 200 of a second modified example of the first embodiment is different from that of the first embodiment in that a plurality of pixels share the floating diffusion region 228.

Figure 24:
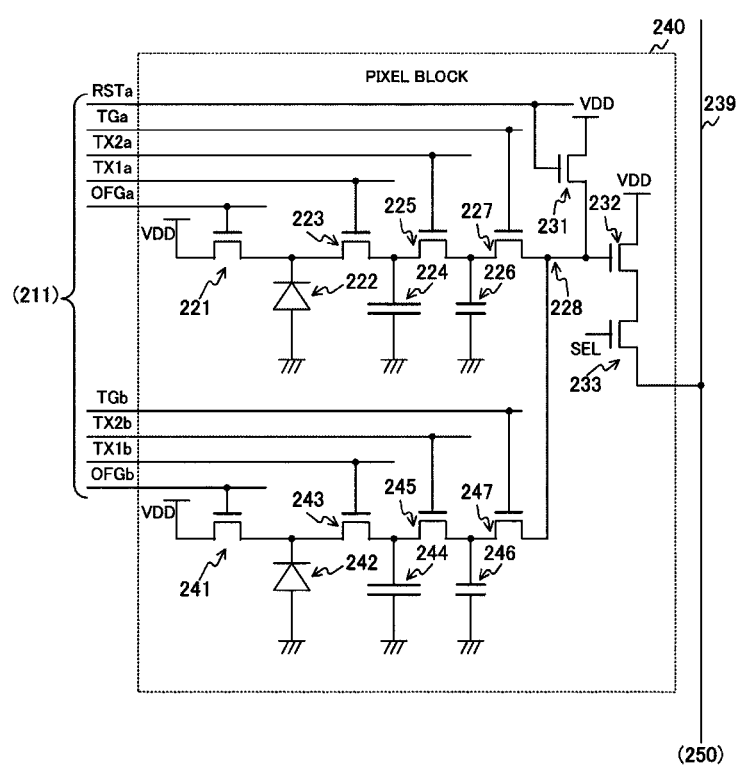
FIG. 24 is a circuit diagram showing a configuration example of a pixel block according to a second modified example of the first embodiment of the present technique.

FIG. 24 is a circuit showing a configuration example of a pixel block 240 according to the second modified example of the first embodiment of the present technique. In the second modified example of the first embodiment, a plurality of pixel blocks 240 are arranged in the pixel array unit 212. Each of the pixel blocks 240 includes charge discharge transistors 221 and 241, photoelectric conversion elements 222 and 242, and transfer transistors 223, 225, 227, 243, 245, and 247. Further, the pixel block 240 includes charge holding regions 224, 226, 244, and 246, the floating diffusion region 228, the reset transistor 231, the amplification transistor 232, and the selection transistor 233.

In the second embodiment, a configuration for connecting the charge discharge transistor 221, the photoelectric conversion element 222, the transfer transistors 223, 225, and 227, the charge holding regions 224 and 226, and the floating diffusion region 228 is the same as that of the first embodiment. A configuration for connecting the charge discharge transistor 241 and the photoelectric conversion element 242, the transfer transistors 243, 245, and 247, and the charge holding regions 244 and 246 is the same as the corresponding element of the first embodiment. A configuration for connecting the reset transistor 231, the amplification transistor 232, and the selection transistor 233 is the same as that of the first embodiment.

Also, the transfer transistors 243, 245, and 247 of the second embodiment are connected in series between a connection node of the charge discharge transistor 241 and the photoelectric conversion element 242, and the floating diffusion region 228. According to the configuration exemplified in the figure, the pixel block 240 functions as two pixels, and these pixels share one floating diffusion region 228.

Since the plurality of pixels share one floating diffusion region 228 in this way, the number of elements per pixel is reduced as compared with the first embodiment in which the plurality of pixels do not share one, so that the circuit scale of the pixel array unit 212 can be reduced.

In addition, the photoelectric conversion elements 221 and 241 are examples of the first and second photoelectric conversion elements described in the claims. The transfer transistors 223 and 243 are examples of the first and second front-stage transfer transistors described in the claims. The transfer transistors 225 and 245 are examples of the first and second intermediate transfer transistors described in the claims. The transfer transistors 227 and 247 are examples of the first and second rear-stage transfer transistors described in the claims. The charge holding regions 224 and 244 are examples of the first and second front-stage charge holding regions described in the claims. The charge holding regions 226 and 246 are examples of the first and second rear-stage charge holding regions described in the claims.

Figure 25:
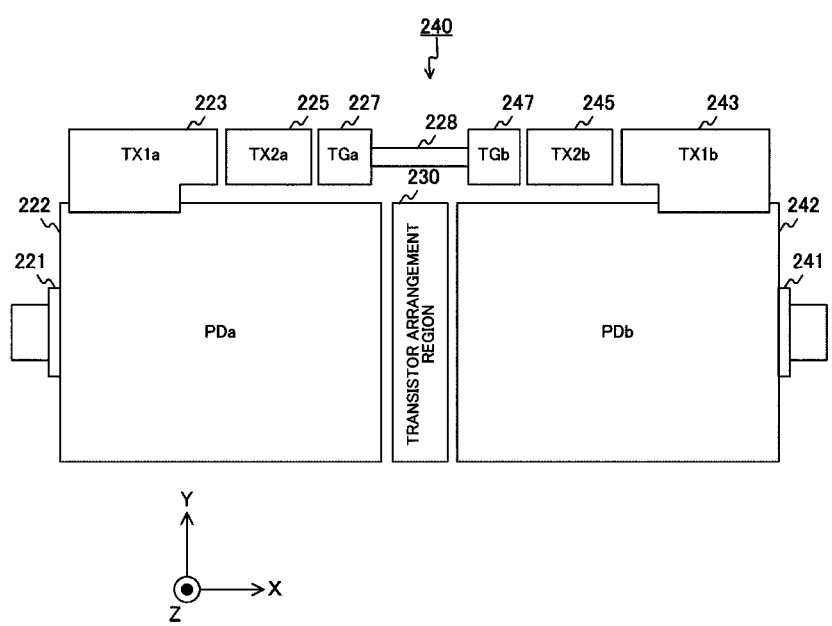
FIG. 25 is a plan view showing an example of a layout of elements in the pixel block according to the second modified example of the first embodiment of the present technique.

FIG. 25 is a diagram showing an example of a layout of elements in the pixel block 240 according to the second modified example of the first embodiment of the present technique. As illustrated in the figure, the charge discharge transistor 221, the photoelectric conversion element 222, and the transfer transistors 223, 225, and 227 are disposed on the left side in the same layout as in the first embodiment. The charge discharge transistor 241, the photoelectric conversion element 242, and the transfer transistors 243, 245, and 247 are disposed on the right side in a symmetrical layout with the left side. The floating diffusion region 228 is disposed between the transfer transistors 227 and 247, and the transistor arrangement region 230 is disposed between the photoelectric conversion elements 222 and 242.

Also, in FIGS. 24 and 25, the number of pixels sharing the floating diffusion region 228 is set to 2, but a plurality of pixels having 3 or more pixels may share the floating diffusion region 228. Further, the first modified example of the first embodiment can be applied to the second modified example of the first embodiment.

As described above, in the second modified example of the first embodiment of the present technique, since a plurality of pixels share one floating diffusion region 228, the number of elements per pixel can be reduced as compared with the case of not sharing.

2. Second Embodiment

In the first embodiment described above, two independent n layers are provided as the charge holding regions 224 and 226, but since two n layers are required for each pixel, an area of the pixel 220 increases, which makes it difficult to obtain a finer pixel. A solid-state imaging element 200 of a second embodiment is different from the first embodiment in that the charge holding regions 224 and 226 are formed in one n-layer.

Figure 26:
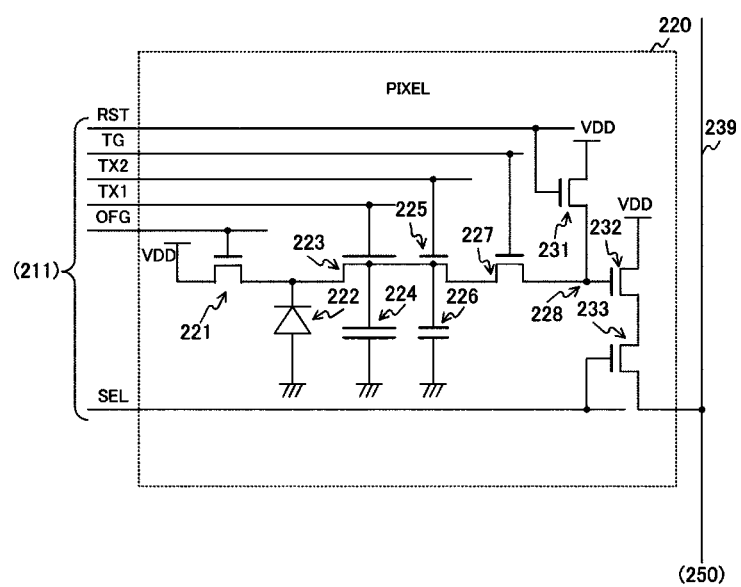
FIG. 26 is a circuit diagram showing a configuration example of a pixel according to a second embodiment of the present technique.

FIG. 26 is a circuit diagram showing a configuration example of the pixel 220 according to the second embodiment of the present technique. The pixel 220 of the second embodiment is different from the first embodiment in that the transfer transistors 223 and 225 share the same n-layer. The charge holding regions 224 and 226 are formed in the n-layer.

Figure 27:
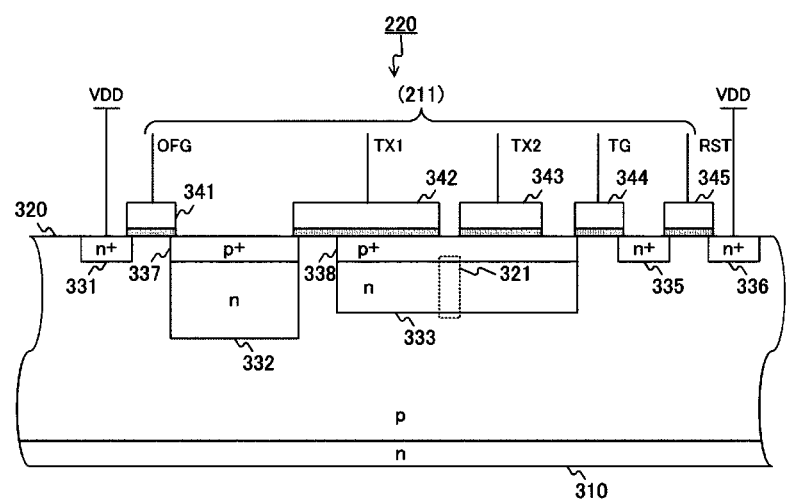
FIG. 27 is an example of a cross-sectional view of the pixel according to the second embodiment of the present technique.

FIG. 27 is an example of a cross-sectional view of the pixel 220 according to the second embodiment of the present technique. In the pixel 220 of the second embodiment, the n layer 334 and the p⁺ layer 339 are not formed, and the gate electrodes 342 and 343 are formed on the n layer 333 and the p⁺ layer 338. In the n layer 333, a left side of the region 321 below a gap between the gate electrodes 342 and 343 is used for the charge holding region 224 (ST1), and a right side thereof is used for the charge holding region 226 (ST2). In this way, ST1 and ST2 are formed in the same n layer 333. Thus, as compared with the case in which two independent n layers are provided for ST1 and ST2, one n layer is not required, and thus the area of the pixel 220 can be reduced.

The region 321 has weaker electrolysis from a gate electrode than the region directly below each of the gate electrodes 342 and 343. For this reason, when the transfer transistors 223 and 225 are turned off, the potential of the region 321 becomes higher than of the region directly under the gate electrode, and a potential barrier is generated in the region 321 between ST1 and ST2.

Figure 28:
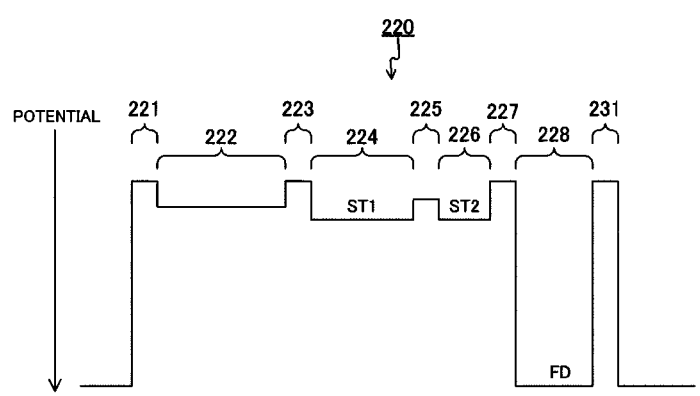
FIG. 28 is an example of a potential diagram of the pixel according to the second embodiment of the present technique.

Further, it is also possible to adjust the potential barrier by adjusting an implantation concentration of impurities in the region 321 at the time of manufacturing. In this case, for example, an impurity concentration of the region 321 is adjusted to be lower than that around it FIG. 28 is an example of a potential diagram of the pixel 220 according to the second embodiment of the present technique. The figure shows the potential when the charge discharge transistor 221, the transfer transistors 223, 225, and 227, and the reset transistor 231 are turned off. As illustrated in the figure, since ST1 and ST2 are formed in the same n layer 333, the potential barrier between them when they are turned off is lower than that in the first embodiment.

Also, the first modified example and the second modified example of the first embodiment can be applied to the second embodiment.

As described above, in the second embodiment of the present technique, since the charge holding region 224 and the charge holding region 226 are formed in the same n layer 333, the n layers can be reduced as compared with the case in which two independent n layers are provided.

3. Third Embodiment

In the second embodiment described above, the charge holding region 224 and the charge holding region 226 have been formed in the same n layer 333, but in this configuration, the height of the potential barrier between them may be insufficient.

A solid-state imaging element 200 of a third embodiment is different from the second embodiment in that a transistor for adjusting the height of the potential barrier is provided.

Figure 29:
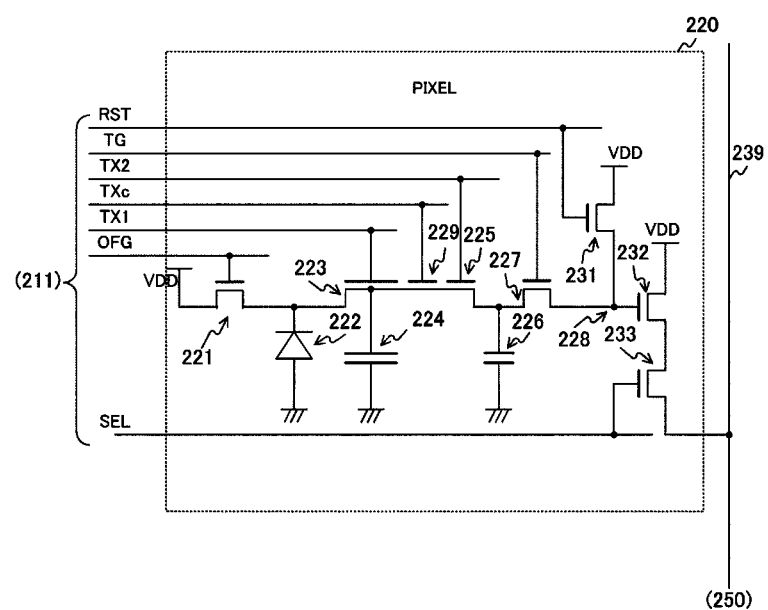
FIG. 29 is a circuit diagram showing a configuration example of a pixel according to a third embodiment of the present technique.

FIG. 29 is a circuit diagram showing a configuration example of the pixel 220 according to the third embodiment of the present technique. The pixel 220 of the third embodiment is different from the second embodiment in that it further includes an adjustment transistor 229.

The adjustment transistor 229 adjusts the potential barrier between the charge holding region 224 and the charge holding region 226 in accordance with a control signal TXc from the vertical scanning circuit 211.

Figure 30:
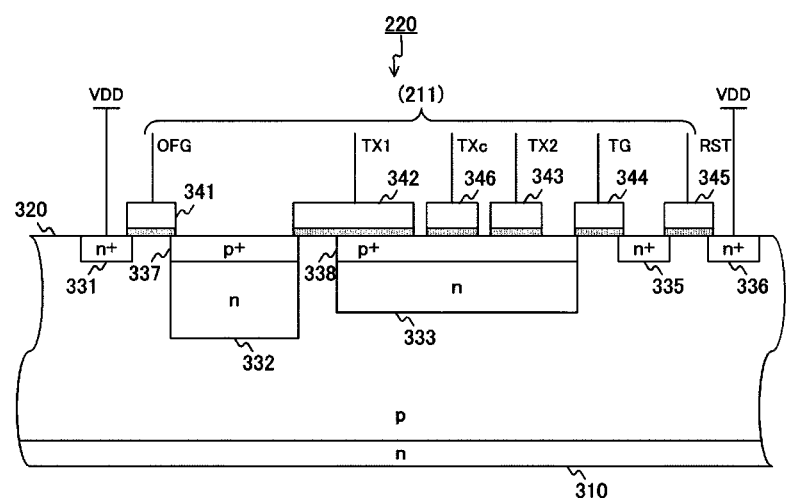
FIG. 30 is an example of a cross-sectional view of the pixel according to the third embodiment of the present technique.

FIG. 30 is an example of a cross-sectional view of the pixel 220 according to the third embodiment of the present technique. The pixel 220 of the third embodiment is different from the second embodiment in that a gate electrode 346 is further provided.

In addition, as in the second embodiment, the region of the n layer 333 immediately below the gate electrode 342 is used for the charge holding region 224 (ST1), and the region directly below the gate electrode 343 is used for the charge holding region 226 (ST2).

The gate electrode 346 is disposed between the gate electrode 342 and the gate electrode 343 (in other words, directly above the potential barrier), and the control signal TXc is input thereto. The gate electrode 346 and the semiconductor region below the gate electrode 346 function as the adjustment transistor 229.

The vertical scanning circuit 211 applies a positive voltage to a gate of the adjustment transistor 229 and lowers a potential under the gate. Further, when it is turned off, the vertical scanning circuit 211 applies a ground or a negative voltage to the adjustment transistor 229. The vertical scanning circuit 211 can adjust the potential barrier by adjusting the voltage applied to the gate of the adjustment transistor 229. When the voltage applied to the gate of the adjustment transistor 229 when it is off (when the charge is held in ST1 or the like) is set lower than those of the transfer transistors 223 and 225 on both sides thereof, the potential barrier immediately below it becomes higher than that around it.

Figure 31:
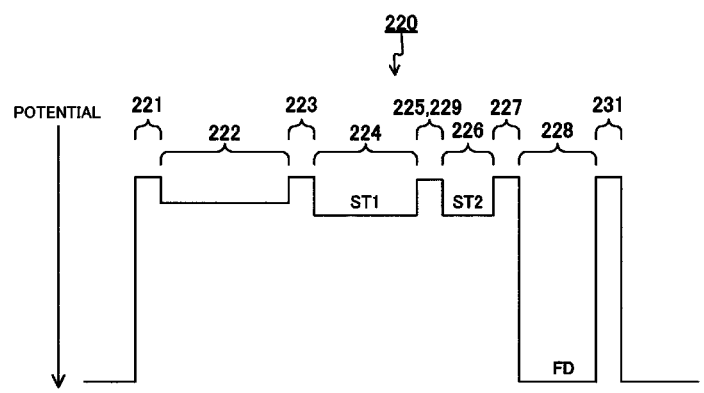
FIG. 31 is an example of a potential diagram of the pixel according to the third embodiment of the present technique.

FIG. 31 is an example of a potential diagram of the pixel 220 according to the second embodiment of the present technique. The figure shows the potential when the charge discharge transistor 221, the transfer transistors 223, 225, and 227, the adjustment transistor 229, and the reset transistor 231 are turned off. As illustrated in the figure, the potential barrier can be raised as compared with the second embodiment by adding the adjustment transistor 229.

Figure 32:
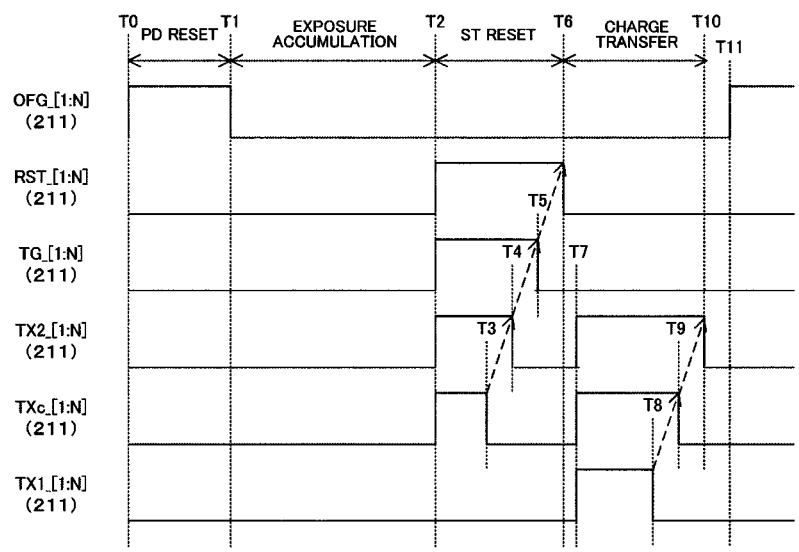
FIG. 32 is a timing chart showing an example of a global shutter operation of a solid-state imaging element according to the third embodiment of the present technique.

FIG. 32 is a timing chart showing an example of a global shutter operation of the solid-state imaging element according to the third embodiment of the present technique. In the third embodiment, control of the PD reset and the exposure accumulation is the same as in the first and second embodiments. At the timing T2, the vertical scanning circuit 211 turns the reset transistor 231, the transfer transistors 225 and 227, and the adjustment transistor 229 of all pixels on in accordance with the reset signal RST, the transfer signal TX2, the TG signal, and the control signal TXc. Thus, the ST reset is performed.

Further, at the timing T3, the vertical scanning circuit 211 turns the adjustment transistor 229 off in accordance with the control signal TXc, and at the timing T4, turns the transfer transistor 225 off in accordance with the transfer signal TX2.

Then, at the timing T5, the vertical scanning circuit 211 turns the transfer transistor 227 off in accordance with the transfer signal TG, and at the timing T6, turns the reset transistor 231 off in accordance with the reset signal RST.

Subsequently, at the timing T7 immediately after the ST reset, the vertical scanning circuit 211 turns the transfer transistors 223 and 227 and the adjustment transistor 229 of all the pixels on in accordance with the transfer signals TX1 and TX2 and the control signal TXc to transfer the charge.

Then, at the timing T8, the vertical scanning circuit 211 turns the transfer transistor 223 off in accordance with the transfer signal TX1, and at the timing T9 immediately after T8, turns the adjustment transistor 229 off in accordance with the control signal TXc. At the timing T10 immediately after T9, the vertical scanning circuit 211 turns the transfer transistor 225 off in accordance with the transfer signal TX2.

Figure 33:
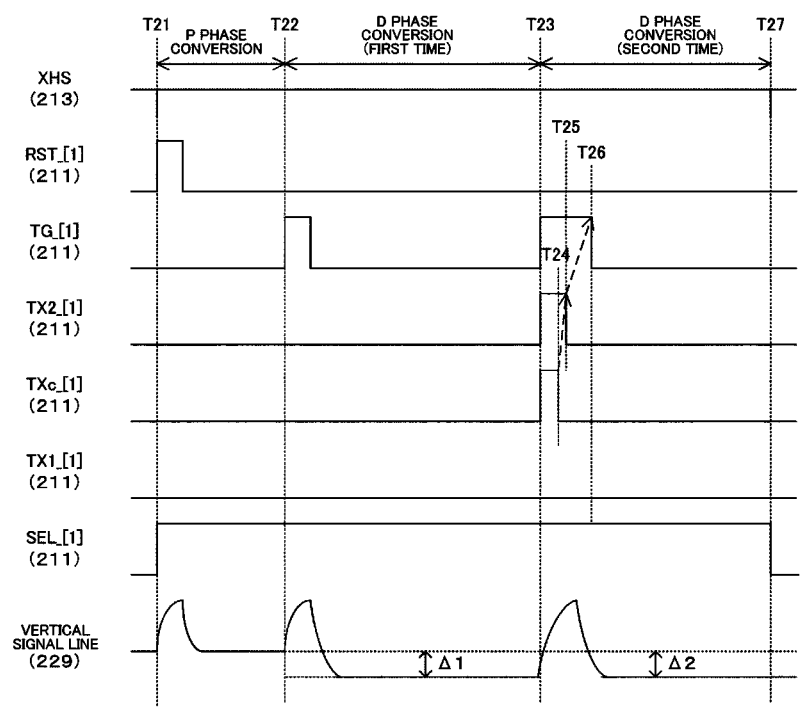
FIG. 33 is a timing chart showing an example of an operation of reading out a row when illuminance is low according to the third embodiment of the present technique.

FIG. 33 is a timing chart showing an example of an operation of reading out a row when illuminance is low according to the third embodiment of the present technique. The control up to immediately before timing T23 is the same as in the first and second embodiments.

At the timing T23, the vertical scanning circuit 211 supplies the transfer signals TG and TX2 and the control signal TXc to turn the transfer transistors 225 and 227 and the adjustment transistor 229 on and transfers the charge to the floating diffusion region 228. Further, at timing T24, the vertical scanning circuit 211 turns the adjustment transistor 229 off in accordance with the control signal TXc, and at timing T25 immediately after T24, turns the transfer transistor 225 off in accordance with the transfer signal TX2. At timing T26 immediately after T25, the vertical scanning circuit 211 turns the transfer transistor 227 off in accordance with the transfer signal TG.

Figure 34:
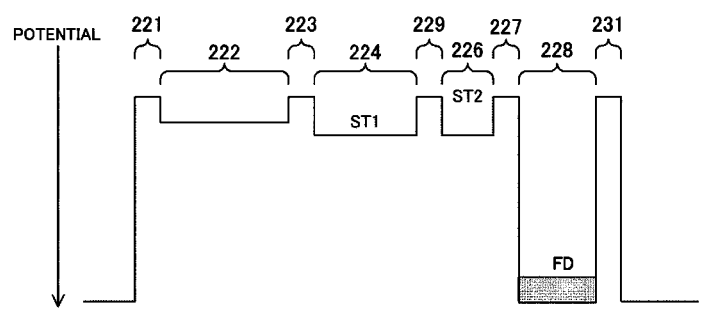
FIG. 34 is an example of a potential diagram at the time of reading out when illuminance is low according to the third embodiment of the present technique.

FIG. 34 is an example of a potential diagram at the time of reading out when illuminance is low according to the third embodiment of the present technique. In a case in which illuminance is low, no signal charge remains in ST1 as illustrated in the figure when the first D phase level is read out. The potential diagram at the time of reading out the second D phase level is the same as that of the first D phase level.

Figure 35:
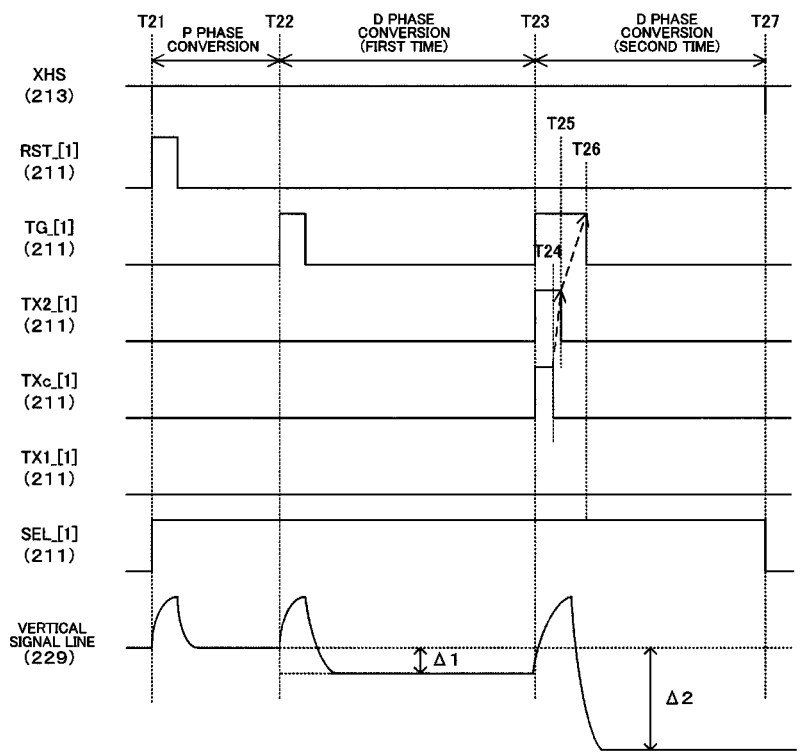
FIG. 35 is a timing chart showing an example of an operation of reading out a row when illuminance is high according to the third embodiment of the present technique.

FIG. 35 is a timing chart showing an example of an operation of reading out a row when illuminance is high according to the third embodiment of the present technique. The readout control in the figure is the same as the control illustrated in FIG. 33.

Figure 36A:
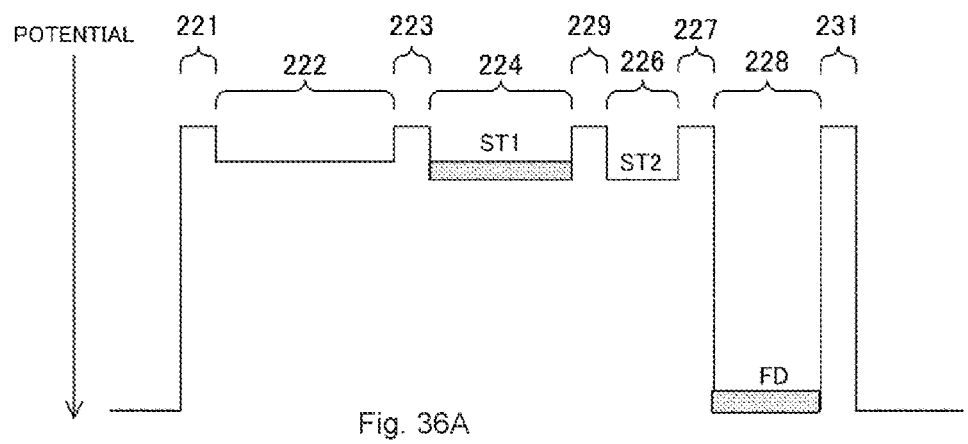
FIGS. 36A and 36B are examples of a potential diagram at the time of reading out when illuminance is high according to the third embodiment of the present technique.
Figure 36B:
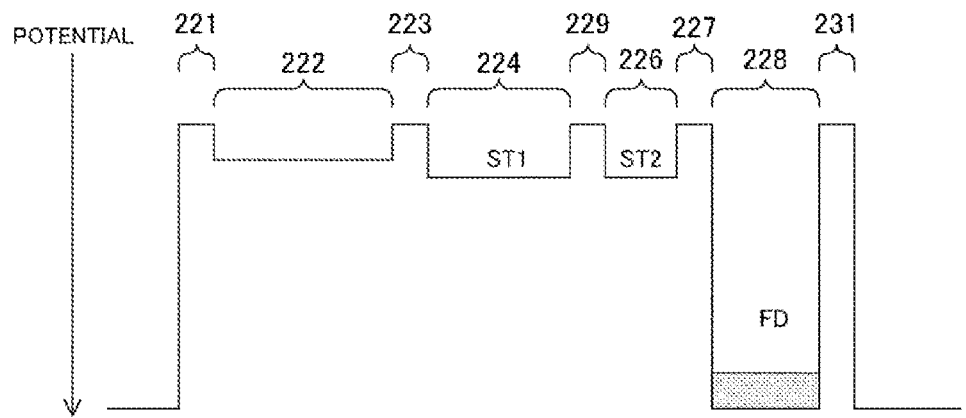

FIGS. 36A and 36B are examples of a potential diagram at the time of reading out when illuminance is high according to the third embodiment of the present technique. FIG. 36A is an example of the potential diagram at the time of reading out the first D phase level, and FIG. 36B is an example of the potential diagram at the time of reading out the second D phase level.

In addition, the first modified example and the second modified example of the first embodiment can be applied to the third embodiment.

As described above, according to the third embodiment of the present technique, since the transistor for adjusting the height of the potential barrier is provided, it is possible to solve shortage of the height of the potential barrier.

4. Example of Application to Mobile Object

The technique according to the present disclosure (the present technique) can be applied to various products. For example, the technique according to the present disclosure may be realized as a device mounted in any type of mobile objects such as automobiles, electric vehicles, hybrid electric vehicles, motorbikes, bicycles, personal mobility, airplanes, drones, ships, and robots.

Figure 37:
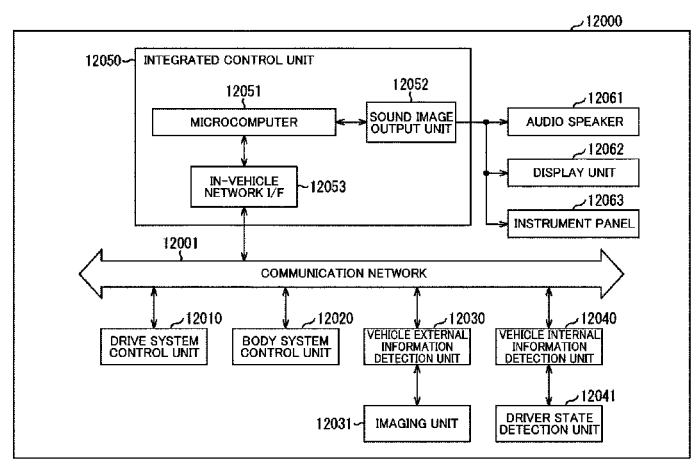
FIG. 37 is a block diagram showing a schematic configuration example of a vehicle control system.

FIG. 37 is a block diagram showing a schematic configuration example of a vehicle control system that is an example of a mobile object control system to which the technique according to the present disclosure can be applied.

A vehicle control system 12000 includes a plurality of electronic control units connected to each other via a communication network 12001. In the example illustrated in FIG. 37, the vehicle control system 12000 includes a drive system control unit 12010, a body system control unit 12020, a vehicle external information detection unit 12030, a vehicle internal information detection unit 12040, and an integrated control unit 12050. In addition, as functional configurations of the integrated control unit 12050, a microcomputer 12051, a sound image output unit 12052, and an in-vehicle network interface (I/F) 12053 are illustrated.

The drive system control unit 12010 controls operations of devices related to a drive system of a vehicle in accordance with various programs. For example, the drive system control unit 12010 functions as a control device of a driving force generation device for generating a driving force of, for example, an internal combustion engine or a driving motor of a vehicle, a driving force transmission mechanism for transmitting a driving force to wheels, a steering mechanism for adjusting a steering angle of a vehicle, a braking device that generates a braking force of a vehicle, and the like.

The body system control unit 12020 controls operations of various devices equipped in a vehicle body in accordance with various programs. For example, the body system control unit 12020 functions as a control device of, for example, a keyless entry system, a smart key system, a power window device, or various lamps such as a headlamp, a back lamp, a brake lamp, a turn signal, or a fog lamp. In this case, radio waves transmitted from a portable device that substitutes for a key or signals of various switches may be input to the body system control unit 12020. The body system control unit 12020 receives inputs of the radio waves or signals and controls a door lock device, a power window device, a lamp, and the like of a vehicle.

The vehicle external information detection unit 12030 detects information outside the vehicle in which the vehicle control system 12000 is mounted. For example, an imaging unit 12031 is connected to the vehicle external information detection unit 12030. The vehicle external information detection unit 12030 causes the imaging unit 12031 to capture an image outside the vehicle and receives the captured image.

The vehicle external information detection unit 12030 may perform object detection processing or distance detection processing for peoples, cars, obstacles, signs, and letters on the road based on the received image.

The imaging unit 12031 is an optical sensor that receives light and outputs an electrical signal in accordance with an amount of received light. The imaging unit 12031 can also output the electrical signal as an image or as ranging information. In addition, the light received by the imaging unit 12031 may be visible light or invisible light such as infrared light.

The vehicle internal information detection unit 12040 detects information on the inside of the vehicle. For example, a driver state detection unit 12041 that detects a driver's state is connected to the vehicle internal information detection unit 12040. The driver state detection unit 12041 includes, for example, a camera that captures an image of the driver, and the vehicle internal information detection unit 12040 may calculate a degree of fatigue or concentration of the driver or may determine whether or not the driver is dozing on the basis of detection information input from the driver state detection unit 12041.

The microcomputer 12051 can calculate a control target value of the driving force generation device, the steering mechanism, or the braking device on the basis of the information inside and outside the vehicle acquired by the vehicle external information detection unit 12030 or the vehicle internal information detection unit 12040, and output a control command to the drive system control unit 12010. For example, the microcomputer 12051 can perform cooperative control for the purpose of realizing functions of an advanced driver assistance system (ADAS) including vehicle collision avoidance, impact mitigation, following traveling based on an inter-vehicle distance, vehicle speed maintenance driving, vehicle collision warning, vehicle lane deviation warning, and the like.

Further, by controlling the driving force generation device, the steering mechanism, the braking device, and the like on the basis of information regarding the vicinity of the vehicle acquired by the vehicle external information detection unit 12030 or the vehicle internal information detection unit 12040, the microcomputer 12051 can perform cooperative control for the purpose of automated driving or the like in which autonomous travel is performed without depending on an operation of the driver.

In addition, the microcomputer 12051 can output a control command to the body system control unit 12020 on the basis of the information outside the vehicle acquired by the vehicle external information detection unit 12030. For example, the microcomputer 12051 can perform cooperative control for the purpose of controlling headlamps in accordance with a position of a preceding vehicle or an oncoming vehicle detected by the vehicle external information detection unit 12030 and achieving antiglare by switching a high beam to a low beam, or the like.

The sound image output unit 12052 transmits an output signal of at least one of sound and an image to an output device capable of visually or audibly notifying an occupant of a vehicle or the outside of the vehicle of information. In the example shown in FIG. 37, an audio speaker 12061, a display unit 12062, and an instrument panel 12063 are exemplified as output devices. The display unit 12062 may include, for example, at least one of an onboard display and a head-up display.

Figure 38:
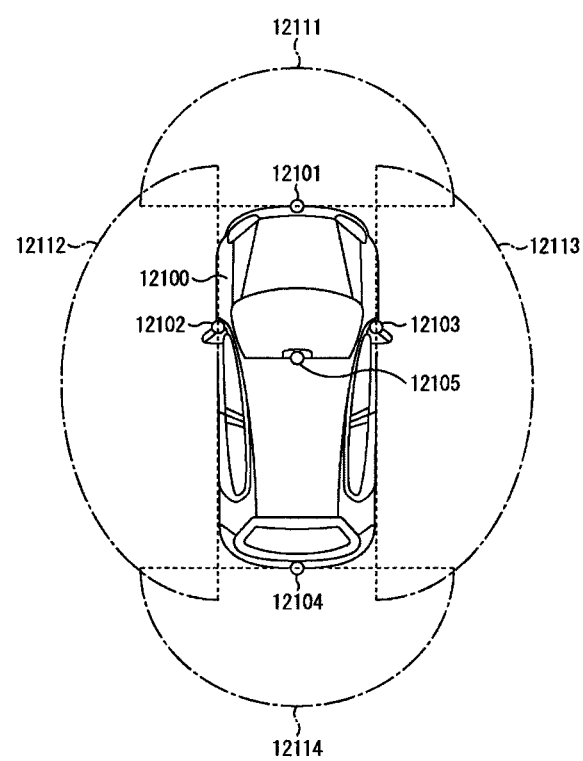
FIG. 38 is an explanatory diagram showing an example of an installation position of an imaging unit.

FIG. 38 is a diagram showing an example of an installation position of the imaging unit 12031.

In FIG. 38, imaging units 12101, 12102, 12103, 12104, and 12105 are provided as the imaging unit 12031.

The imaging units 12101, 12102, 12103, 12104, and 12105 are provided at positions such as a front nose, side-view mirrors, a rear bumper, a back door, and an upper portion of a windshield in a vehicle interior of a vehicle 12100, for example. The imaging unit 12101 provided on the front nose and the imaging unit 12105 provided in the upper portion of the windshield in the vehicle interior mainly acquire images in front of the vehicle 12100. The imaging units 12102 and 12103 provided on the side mirrors mainly acquire images on a lateral side of the vehicle 12100. The imaging unit 12104 provided on the rear bumper or the back door mainly acquires images behind the vehicle 12100. The imaging unit 12105 provided in the upper portion of the windshield in the vehicle interior is mainly used to detect preceding vehicles, pedestrians, obstacles, traffic signals, traffic signs, lanes, and the like.

Also, FIG. 38 shows an example of imaging ranges of the imaging units 12101 to 12104. An imaging range 12111 indicates an imaging range of the imaging unit 12101 provided at the front nose, imaging ranges 12112 and 12113 respectively indicate imaging ranges of the imaging units 12102 and 12103 provided at the side mirrors, and an imaging range 12114 indicates an imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function of acquiring distance information. For example, at least one of the imaging units 12101 to 12104 may be a stereo camera configured of a plurality of imaging elements or may be an imaging element having pixels for phase difference detection.

For example, by obtaining distances to each three-dimensional object within the imaging range 12111 to 12114 and changes of the distances over time (relative velocity with respect to the vehicle 12100) on the basis of distance information obtained from the imaging units 12101 to 12104, the microcomputer 12051 can extract, particularly, the closest three-dimensional object on a traveling path of the vehicle 12100, which is a three-dimensional object traveling at a predetermined speed (for example, 0 km/h or higher) in the substantially same direction as the vehicle 12100, as a preceding vehicle. Further, the microcomputer 12051 can set an inter-vehicle distance to be secured in advance from the preceding vehicle and can perform automated braking control (also including following stop control) or automated acceleration control (also including following start control). In this way, it is possible to perform cooperative control for the purpose of automated driving or the like in which autonomous travel is performed without depending on an operation of the driver.

For example, the microcomputer 12051 can classify and extract three-dimensional object data regarding three-dimensional objects into two-wheeled vehicles, ordinary vehicles, large vehicles, pedestrians, and other three-dimensional objects such as utility poles on the basis of the distance information obtained from the imaging units 12101 to 12104 and use the three-dimensional object data for automatic avoidance of obstacles. For example, the microcomputer 12051 identifies obstacles in the vicinity of the vehicle 12100 into obstacles that can be visually recognized by the driver of the vehicle 12100 and obstacles that are difficult to be visually recognized. In addition, the microcomputer 12051 determines a collision risk indicating a degree of risk of collision with each obstacle, and when the collision risk is equal to or greater than a set value and there is a possibility of collision, outputs a warning to the driver via the audio speaker 12061 or the display unit 12062 and performs forced deceleration or avoidance steering via the drive system control unit 12010, so that it can perform driving assistance for collision avoidance.

At least one of the imaging units 12101 to 12104 may be an infrared camera that detects infrared light. For example, the microcomputer 12051 can recognize a pedestrian by determining whether or not a pedestrian is present in captured images of the imaging units 12101 to 12104. Such recognition of a pedestrian is performed through, for example, a procedure of extracting feature points in the captured images of the imaging units 12101 to 12104 serving as infrared cameras, and a procedure of performing pattern matching processing on a series of feature points indicating a contour of an object to determine whether or not the object is a pedestrian. When the microcomputer 12051 determines that a pedestrian is present in the captured images of the imaging units 12101 to 12104 and recognizes the pedestrian, the sound image output unit 12052 controls the display unit 12062 such that a square contour line for emphasis is superimposed on the recognized pedestrian and is displayed. In addition, the sound image output unit 12052 may control the display unit 12062 so that an icon or the like indicating a pedestrian is displayed at a desired position.

An example of the vehicle control system to which the technique according to the present disclosure may be applied has been described above. The technique according to the present disclosure may be applied to the imaging unit 12031 and the like among the configurations described above. Specifically, the imaging device 100 of FIG. 1 can be applied to the imaging unit 12031. By applying the technique according to the present disclosure to the imaging unit 12031, PLS resistance is improved, a clearer captured image can be obtained, and thus it is possible to reduce a driver's fatigue.

Also, the above-described embodiments show examples for embodying the present technique, and matters in the embodiments and matters specifying the inventions in the claims have a corresponding relationship with each other. Similarly, the matters specifying the inventions in the claims and the matters in the embodiments of the present technique having the same name have a corresponding relationship with each other. However, the present technique is not limited to the embodiments and can be embodied by applying various modifications to the embodiments without departing from the gist thereof.

In addition, the effects described in the present specification are merely examples and are not intended as limiting, and other effects may be obtained.

The present technique can also have the following configurations.

(1) A solid-state imaging element including:
a photoelectric conversion element;
a front-stage charge holding region;
a rear-stage charge holding region having a different capacity from the front-stage charge holding region;
a front-stage transfer transistor that transfers a charge from the photoelectric conversion element to the front-stage charge holding region and the rear-stage charge holding region;
a rear-stage transfer transistor that transfers the charge from the rear-stage charge holding region to a floating diffusion region;
an intermediate transfer transistor that transfers a charge, which remains in the front-stage charge holding region after the charge has been transferred from the rear-stage charge holding region to the floating diffusion region, to the floating diffusion region via the front-stage charge holding region; and
a light-shielding wall that prevents the charge from leaking from the photoelectric conversion element to the rear-stage charge holding region.

(2) The solid-state imaging element according to the above (1),
wherein the front-stage charge holding region and the rear-stage charge holding region are impurity diffusion regions having the same polarity, and
a predetermined impurity diffusion region having a different polarity from those of both the front-stage charge holding region and the rear-stage charge holding region is disposed between the front-stage charge holding region and the rear-stage charge holding region.

(3) The solid-state imaging element according to the above (1),
wherein the front-stage charge holding region and the rear-stage charge holding region are formed in the same impurity diffusion region.

(4) The solid-state imaging element according to the above (3),
wherein an impurity concentration in a region between the front-stage charge holding region and the rear-stage charge holding region in the impurity diffusion region is different from that around the region.

(5) The solid-state imaging element according to the above (3), further including an adjustment transistor that adjusts a height of the potential barrier between the front-stage charge holding region and the rear-stage charge holding region.

(6) The solid-state imaging element according to any one of the above (1) to (5), further including
a vertical scanning circuit that controls each of the front-stage transfer transistor, the rear-stage transfer transistor, and the intermediate transfer transistor to be turned either on or off,
wherein the vertical scanning circuit turns the front-stage transfer transistor and the intermediate transfer transistor on while turning the rear-stage transfer transistor off to transfer the charge to the front-stage charge holding region and the rear-stage charge holding region, turns the rear-stage transfer transistor on while turning the front-stage transfer transistor and the intermediate transfer transistor off to transfer the charge from the rear-stage charge holding region to the floating diffusion region, and turns the intermediate transfer transistor and the rear-stage transfer transistor on to transfer the charge from the front-stage charge holding region to the floating diffusion region.

(7) The solid-state imaging element according to any one of the above (1) to (6), further including
a signal processing circuit that compares, between a first pixel signal corresponding to an amount of charge of the rear-stage charge holding region and a second pixel signal corresponding to an amount of charge of the front-stage charge holding region, the first pixel signal with a predetermined threshold and performs processing of selecting one of the first and second pixel signals on the basis of a comparison result.

(8) The solid-state imaging element according to any one of the above (1) to (7), wherein the photoelectric conversion element is formed on a wired front surface of both surfaces of a predetermined semiconductor substrate.

(9) The solid-state imaging element according to any one of the above (1) to (7), wherein the photoelectric conversion element is formed on a back surface of a wired front surface of both surfaces of a predetermined semiconductor substrate.

(10) The solid-state imaging element according to any one of the above (1) to (9),
wherein the photoelectric conversion element includes first and second photoelectric conversion elements,
the front-stage charge holding region includes first and second front-stage charge holding regions,
the rear-stage charge holding region includes first and second rear-stage charge holding regions,
the front-stage transfer transistor includes first and second front-stage transfer transistors,
the intermediate transfer transistor includes first and second intermediate transfer transistors, and
the rear-stage transfer transistor includes first and second rear-stage transfer transistors.

(11) The solid-state imaging element according to any one of the above (1) to (10), further comprising:
a charge discharge transistor that discharges the charge from the photoelectric conversion element,
a reset transistor that initializes the floating diffusion region,
an amplification transistor that amplifies the signal corresponding to the amount of charge transferred to the floating diffusion region, and
a selection transistor that outputs the amplified signal as a pixel signal in accordance with a predetermined selection signal.

(12) An imaging device including:
a photoelectric conversion element;
a front-stage charge holding region;
a rear-stage charge holding region having a different capacity from the front-stage charge holding region;
a front-stage transfer transistor that transfers a charge from the photoelectric conversion element to the front-stage charge holding region and the rear-stage charge holding region;
a rear-stage transfer transistor that transfers the charge from the rear-stage charge holding region to a floating diffusion region;
an intermediate transfer transistor that transfers a charge, which remains in the front-stage charge holding region after the charge has been transferred from the rear-stage charge holding region to the floating diffusion region, to the floating diffusion region via the front-stage charge holding region;
a light-shielding wall that prevents the charge from leaking from the photoelectric conversion element to the rear-stage charge holding region; and a signal processing circuit that processes a pixel signal in accordance with an amount of charge transferred to the floating diffusion region.

(13) A method for controlling a solid-state imaging element comprising:
a front-stage transfer procedure of transferring a charge from a photoelectric conversion element to a front-stage charge holding region and a rear-stage charge holding region which have different capacities;
a rear-stage transfer procedure of transferring the charge from the rear-stage charge holding region in which leakage of charge to the photoelectric conversion element is prevented by a light-shielding wall to a floating diffusion region; and
an intermediate transfer procedure of transferring a charge, which remains in the front-stage charge holding region after the charge has been transferred from the rear-stage charge holding region to the floating diffusion region, to the floating diffusion region via the front-stage charge holding region.

REFERENCE SIGNS LIST

100 Imaging device
110 Imaging lens
120 Recording unit
130 Imaging control unit
200 Solid-state imaging element
211 Vertical scanning circuit
212 Pixel array unit
213 Timing control circuit
214 DAC
220 Pixel
221, 241 Charge discharge transistor
222, 242 Photoelectric conversion element
223, 225, 227, 243, 245, 247 Transfer transistor
224, 226, 244, 246 Charge holding region
228 Floating diffusion region
229 Adjustment transistor
230 Transistor arrangement region
231 Reset transistor
232 Amplification transistor
233 Selection transistor
240 Pixel block
250 Load MOS circuit block
251 Load MOS transistor
260 Column signal processing circuit
261 ADC
262 Digital signal processing unit
310 n-type semiconductor substrate
320 p-type semiconductor substrate
331, 335, 336 $n^+$ layer
332, 333, 334 n layer
337 to 339 $p^+$ layer
341 to 346 Gate electrode
411, 412, 416, 417 Light-shielding wall
413 Charge transfer channel
414 Wiring layer
421 Metal
12031 Imaging unit

The invention claimed is:

1. A solid-state imaging element, comprising:
a photoelectric conversion element;
a front-stage charge holding region;
a rear-stage charge holding region, wherein a capacity of the rear-stage charge holding region is different from a capacity of the front-stage charge holding region;
a front-stage transfer transistor configured to transfer a first charge from the photoelectric conversion element to the front-stage charge holding region and the rear-stage charge holding region;
a rear-stage transfer transistor configured to transfer the first charge from the rear-stage charge holding region to a floating diffusion region;
an intermediate transfer transistor configured to transfer a second charge, which remains in the front-stage charge holding region after the first charge has been transferred from the rear-stage charge holding region to the floating diffusion region, to the floating diffusion region via the front-stage charge holding region;
a light-shielding wall configured to prevent the first charge to leak from the photoelectric conversion element to the rear-stage charge holding region; and
a signal processing circuit configured to:
compare, between a first pixel signal corresponding to an amount of charge transferred from the rear-stage charge holding region and a second pixel signal corresponding to an amount of charge transferred from the front-stage charge holding region and the rear-stage charge holding region, the first pixel signal with a specific threshold; and
select one of the first pixel signal or the second pixel signal based on a comparison result.

2. The solid-state imaging element according to claim 1, wherein
the front-stage charge holding region and the rear-stage charge holding region are impurity diffusion regions,
a polarity of the front-stage charge holding region is same as a polarity of the rear-stage charge holding region,
a specific impurity diffusion region is between the front-stage charge holding region and the rear-stage charge holding region, and
a polarity of the specific impurity diffusion region is different from the polarity of the front-stage charge holding region and the rear-stage charge holding region.

3. The solid-state imaging element according to claim 1, wherein the front-stage charge holding region and the rear-stage charge holding region are in a same impurity diffusion region.

4. The solid-state imaging element according to claim 3, wherein an impurity concentration in a specific region between the front-stage charge holding region and the rear-stage charge holding region in the same impurity diffusion region is different from an impurity concentration in a vicinity of the specific region.

5. The solid-state imaging element according to claim 3, further comprising an adjustment transistor configured to adjust a height of a potential barrier between the front-stage charge holding region and the rear-stage charge holding region.

6. The solid-state imaging element according to claim 1, further comprising a vertical scanning circuit configured to:
control each of the front-stage transfer transistor, the rear-stage transfer transistor, and the intermediate transfer transistor to be turned on or off;
turn the front-stage transfer transistor and the intermediate transfer transistor on while the rear-stage transfer transistor is off to transfer the first charge to the front-stage charge holding region and the rear-stage charge holding region;
turn the rear-stage transfer transistor on while the front-stage transfer transistor and the intermediate transfer transistor are off to transfer the charge from the rear-stage charge holding region to the floating diffusion region; and turn the intermediate transfer transistor and the rear-stage transfer transistor on to transfer the first charge from the front-stage charge holding region to the floating diffusion region.

7. The solid-state imaging element according to claim 1, further comprising a specific semiconductor substrate, wherein the photoelectric conversion element is on a wired front surface of both surfaces of the specific semiconductor substrate.

8. The solid-state imaging element according to claim 1, further comprising a specific semiconductor substrate, wherein the photoelectric conversion element is on a back surface of a wired front surface of both surfaces of the specific semiconductor substrate.

9. The solid-state imaging element according to claim 1, wherein
the photoelectric conversion element includes a first photoelectric conversion element and a second photoelectric conversion element,
the front-stage charge holding region includes a first front-stage charge holding region and a second front-stage charge holding region,
the rear-stage charge holding region includes a first rear-stage charge holding region and a second rear-stage charge holding region,
the front-stage transfer transistor includes a first front-stage transfer transistor and a second front-stage transfer transistor,
the intermediate transfer transistor includes a first intermediate transfer transistor and a second intermediate transfer transistor, and
the rear-stage transfer transistor includes a first rear-stage transfer transistor and a second rear-stage transfer transistor.

10. The solid-state imaging element according to claim 1, further comprising:
a charge discharge transistor configured to discharge the first charge from the photoelectric conversion element;
a reset transistor configured to initialize the floating diffusion region;
an amplification transistor configured to amplify a signal corresponding to an amount of charge transferred to the floating diffusion region; and
a selection transistor configured to output the amplified signal as a pixel signal based on a specific selection signal.

11. An imaging device, comprising:
a photoelectric conversion element;
a front-stage charge holding region;
a rear-stage charge holding region, wherein a capacity of the rear-stage charge holding region is different from a capacity of the front-stage charge holding region;
a front-stage transfer transistor configured to transfer a first charge from the photoelectric conversion element to the front-stage charge holding region and the rear-stage charge holding region;
a rear-stage transfer transistor configured to transfer the first charge from the rear-stage charge holding region to a floating diffusion region;
an intermediate transfer transistor configured to transfer a second charge, which remains in the front-stage charge holding region after the first charge has been transferred from the rear-stage charge holding region to the floating diffusion region, to the floating diffusion region via the front-stage charge holding region;
a light-shielding wall configured to prevent the first charge to leak from the photoelectric conversion element to the rear-stage charge holding region; and
a signal processing circuit configured to:
compare, between a first pixel signal corresponding to an amount of charge transferred from the rear-stage charge holding region and a second pixel signal corresponding to an amount of charge transferred from the front-stage charge holding region and the rear-stage charge holding region, the first pixel signal with a specific threshold;
select one of the first pixel signal or the second pixel signal based on a comparison result; and
process the selected one of the first pixel signal or the second pixel signal.

12. A method, comprising:
in a solid-state imaging element comprising:
transferring a first charge from a photoelectric conversion element to a front-stage charge holding region and a rear-stage charge holding region which have different capacities;
transferring the first charge from the rear-stage charge holding region in which leakage of the first charge to the photoelectric conversion element is prevented by a light-shielding wall to a floating diffusion region;
transferring a second charge, which remains in the front-stage charge holding region after the first charge has been transferred from the rear-stage charge holding region to the floating diffusion region, to the floating diffusion region via the front-stage charge holding region;
comparing, between a first pixel signal corresponding to an amount of charge transferred from the rear-stage charge holding region and a second pixel signal corresponding to an amount of charge transferred from the front-stage charge holding region and the rear-stage charge holding region, the first pixel signal with a specific threshold; and
selecting one of the first pixel signal or the second pixel signal based on a comparison result.

* * * * *